(12) United States Patent  
Mizukami

(10) Patent No.: US 9,627,606 B2  
(45) Date of Patent: Apr. 18, 2017

(54) ELECTROMECHANICAL TRANSDUCER ELEMENT, METHOD OF PRODUCING THE ELECTROMECHANICAL TRANSDUCER ELEMENT, DROPLET DISCHARGE HEAD, AND DROPLET DISCHARGE APPARATUS

(71) Applicant: Satoshi Mizukami, Kanagawa (JP)

(72) Inventor: Satoshi Mizukami, Kanagawa (JP)

(73) Assignee: RICOH COMPANY, LTD., Tokyo (JP)

( * ) Notice: Subject to any disclaimer, the term of this patent is extended or adjusted under 35 U.S.C. 154(b) by 0 days.

(21) Appl. No.: 15/166,503

(22) Filed: May 27, 2016

(65) Prior Publication Data

US 2016/0351788 A1   Dec. 1, 2016

(30) Foreign Application Priority Data

May 28, 2015   (JP) .................................. 2015-108722

(51) Int. Cl.
 | | |
 |---|---|
 | *B41J 2/14* | (2006.01) |
 | *H01L 41/187* | (2006.01) |
 | *H01L 41/257* | (2013.01) |

(52) U.S. Cl.
CPC ........ *H01L 41/187* (2013.01); *B41J 2/14233* (2013.01); *H01L 41/257* (2013.01); *B41J 2002/14258* (2013.01)

(58) Field of Classification Search
CPC ..... H01L 41/187; H01L 41/257; H01L 41/04; H01L 41/18; H01L 41/08; B41J 2/14233; B41J 2002/14258
See application file for complete search history.

(56) References Cited

U.S. PATENT DOCUMENTS

| 2013/0002767 A1 | 1/2013 | Mizukami et al. |
| 2014/0368583 A1* | 12/2014 | Morozumi .......... H01L 41/1876 347/68 |

(Continued)

FOREIGN PATENT DOCUMENTS

| JP | 2005-175099 | 6/2005 |
| JP | 2007-096248 | 4/2007 |

(Continued)

OTHER PUBLICATIONS

U.S. Appl. No. 14/867,350, filed Sep. 28, 2015.

*Primary Examiner* — Alessandro Amari  
*Assistant Examiner* — Michael Konczal  
(74) *Attorney, Agent, or Firm* — Cooper & Dunham LLP

(57) ABSTRACT

An electromechanical transducer element includes a first electrode, an electromechanical transducer film, and a second electrode. The electromechanical transducer film is a {100} preferentially oriented polycrystalline film. A sum of an orientation degree ρ{111} of {111} plane and an orientation degree ρ{100} of {100} plane is in a range of not less than 0.0002 and not greater than 0.25. At least two diffraction peaks of a plurality of diffraction peaks separated in diffraction peaks derived from {200} plane or {400} plane obtained by the θ-2θ measurement of the electromechanical transducer film according to the X-ray diffraction method attribute to a tetragonal a-domain structure and a tetragonal c-domain structure, respectively. A value of Sc/(Sa+Sc) is not greater than 20%, where Sa represents an area of a diffraction peak attributing to the tetragonal a-domain structure and Sc represents an area of a diffraction peak attributing to the tetragonal c-domain structure.

10 Claims, 12 Drawing Sheets

(56) References Cited

U.S. PATENT DOCUMENTS

| | | |
|---|---|---|
| 2015/0263263 A1 | 9/2015 | Akiyama et al. |
| 2015/0266296 A1 | 9/2015 | Mizukami et al. |
| 2015/0349240 A1 | 12/2015 | Mizukami |
| 2016/0236470 A1* | 8/2016 | Mizukami ............ B41J 2/14233 |

FOREIGN PATENT DOCUMENTS

| | | |
|---|---|---|
| JP | 2007-258389 | 10/2007 |
| JP | 2007-288123 | 11/2007 |
| JP | 2008-218675 | 9/2008 |

* cited by examiner

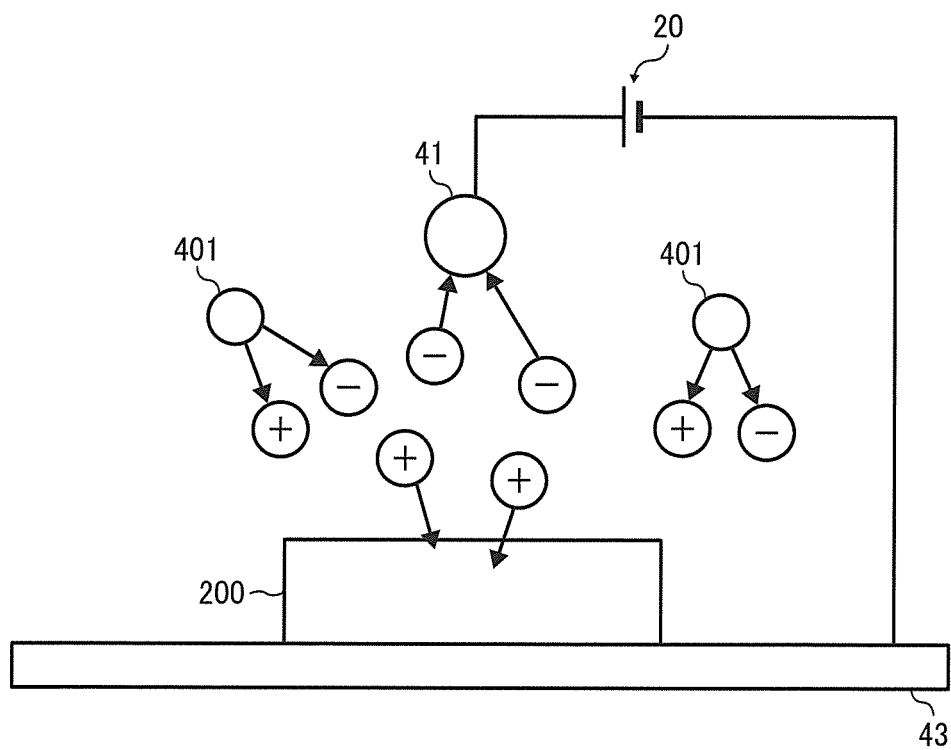

ELECTROMECHANICAL TRANSDUCER ELEMENT, METHOD OF PRODUCING THE ELECTROMECHANICAL TRANSDUCER ELEMENT, DROPLET DISCHARGE HEAD, AND DROPLET DISCHARGE APPARATUS

CROSS-REFERENCE TO RELATED APPLICATION

This patent application is based on and claims priority pursuant to 35 U.S.C. §119(a) to Japanese Patent Application No. 2015-108722, filed on May 28, 2015, in the Japan Patent Office, the entire disclosure of which is hereby incorporated by reference herein.

BACKGROUND

Technical Field

Aspects of the present disclosure relate to an electromechanical transducer element, a method of producing the electromechanical transducer element, and a droplet discharge head and a droplet discharge apparatus incorporating the electromechanical transducer element.

Related Art

An electromechanical transducer element used in a droplet discharge head is known that includes a piezoelectric film having a perovskite crystal structure, such as lead zirconate titanate (PZT), and a lower electrode and an upper electrode with the piezoelectric film interposed in between. When a voltage is applied between the lower electrode and the upper electrode of the electromechanical transducer element, an electric field is formed in a direction of thickness (film thickness direction) of the piezoelectric film, thus allowing the electromechanical transducer element to be deformed by the piezoelectric effect of the piezoelectric film.

SUMMARY

In an aspect of this disclosure, there is provided an electromechanical transducer element that includes a first electrode, an electromechanical transducer film, and a second electrode. The first electrode is directly on or indirectly above one of a substrate and a base film. The electromechanical transducer film is disposed on the first electrode and having a perovskite crystal. The second electrode is disposed on the electromechanical transducer film. The electromechanical transducer film is a {100} preferentially oriented polycrystalline film in which {100} plane is preferentially oriented. A sum of an orientation degree ρ{111} of {111} plane and an orientation degree ρ{100} of {100} plane is in a range of not less than 0.0002 and not greater than 0.25, where I{hkl} represents a peak intensity of a diffraction peak derived from an {hkl} plane obtained by a θ-2θ measurement of the electromechanical transducer film according to an X-ray diffraction method, ΣI{hkl} represents a total sum of peak intensities of a plurality of diffraction peaks obtained by the θ-2θ measurement of the electromechanical transducer film according to an X-ray diffraction method, and ρ{hkl} represents an orientation degree of an {hkl} plane of the electromechanical transducer film and is expressed by a formula of ρ{hkl}=I{hkl}/ΣI{hkl}. At least two diffraction peaks of a plurality of diffraction peaks separated in diffraction peaks derived from {200} plane or {400} plane obtained by the θ-2θ measurement of the electromechanical transducer film according to the X-ray diffraction method attribute to a tetragonal a-domain structure and a tetragonal c-domain structure, respectively. A value of Sc/(Sa+Sc) is not greater than 20%, where Sa represents an area of a diffraction peak attributing to the tetragonal a-domain structure and Sc represents an area of a diffraction peak attributing to the tetragonal c-domain structure.

In another aspect of this disclosure, there is provided a method of producing the electromechanical transducer element. The method includes forming the first electrode directly on or indirectly above one of the substrate and the base film, forming the electromechanical transducer film on the first electrode, forming the second electrode on the electromechanical transducer film, and performing polarization processing on the electromechanical transducer film with positive charges generated by corona discharge.

In still another aspect of this disclosure, there is provided a droplet discharge head that includes a nozzle to discharge droplets, a pressurizing chamber communicated with the nozzle, and a discharge drive unit to increase a pressure of liquid in the pressurizing chamber. The discharge drive unit includes a diaphragm constituting part of a wall of the pressurizing chamber and the electromechanical transducer element disposed on the diaphragm.

In still yet another aspect of this disclosure, there is provided a droplet discharge apparatus that includes the droplet discharge head.

BRIEF DESCRIPTION OF THE SEVERAL VIEWS OF THE DRAWINGS

The aforementioned and other aspects, features, and advantages of the present disclosure would be better understood by reference to the following detailed description when considered in connection with the accompanying drawings, wherein:

FIG. 5 is an illustration of polarization processing in the polarization processing device of FIG. 4;

Figure 1:
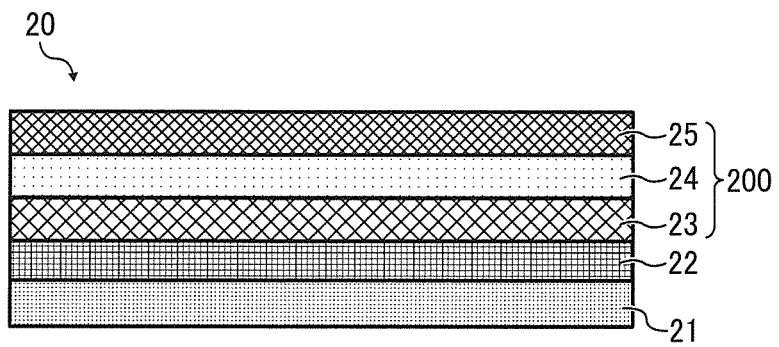
FIG. 1 is a cross-sectional view of an example of the configuration of an electromechanical transducer element according to an embodiment of the present disclosure.

The accompanying drawings are intended to depict embodiments of the present disclosure and should not be interpreted to limit the scope thereof. The accompanying drawings are not to be considered as drawn to scale unless explicitly noted.

DETAILED DESCRIPTION

In describing embodiments illustrated in the drawings, specific terminology is employed for the sake of clarity. However, the disclosure of this patent specification is not intended to be limited to the specific terminology so selected and it is to be understood that each specific element includes all technical equivalents that operate in a similar manner and achieve similar results.

Although the embodiments are described with technical limitations with reference to the attached drawings, such description is not intended to limit the scope of the disclosure and all of the components or elements described in the embodiments of this disclosure are not necessarily indispensable.

Hereinafter, embodiments of the present disclosure are described with reference to the attached drawings. Referring now to the drawings, wherein like reference numerals designate identical or corresponding parts throughout the several views, exemplary embodiments of the present disclosure are described below.

Below, a description is given of an electromechanical transducer element according to embodiments of the present disclosure, constituting part of a droplet discharge head used in an inkjet recording apparatus as an example of an image forming apparatus. Note that the claimed invention is not limited to the following exemplary embodiments.

Inkjet recording apparatuses have many advantages, such as extremely noiseless operation, high-speed printing, a high degree of flexibility in ink, i.e., liquid for image formation, and availability of low-cost plain paper. Accordingly, inkjet recording apparatuses are widely used as image forming apparatuses, such as printers, facsimile machines, and copiers.

A droplet discharge head used in such an inkjet recording apparatus includes, for example, nozzles to discharge droplets of liquid (ink) for image formation, pressurization chambers communicated with the nozzles, and pressure generators to generate pressure to discharge ink from the pressurization chambers. A pressure generator according to this embodiment is a piezo-type pressure generator including a diaphragm and an electromechanical transducer element. The diaphragm constitutes part of a wall of a pressurization chamber, and the electromechanical transducer element includes a thin electromechanical transducer film made of a piezoelectric material to deform the diaphragm. When a predetermined voltage is applied to the electromechanical transducer element, the electromechanical transducer element deforms to displace a surface of the diaphragm toward the pressurization chamber, thus generating pressure in liquid in the pressurization chamber. The pressure allows liquid droplets (ink droplets) to be discharged from a nozzle communicated with the pressurization chamber.

The piezoelectric material constituting the electromechanical transducer film is made of a material having piezoelectric properties of being deformed by application of voltage. In this embodiment, as the piezoelectric material, lead zirconate titanate (PZT: $Pb(Zr_x, Ti_{1-x})O_3$) is used that is a ternary metal oxide having a crystal structure of perovskite. There are a plurality of types of vibration modes on application of a drive voltage to the electromechanical transducer element including the electromechanical transducer film made of PZT (hereinafter, PZT film). Examples of variation modes include a vertical vibration mode (push mode) involving deformation in a film thickness direction with piezoelectric constant d33, a lateral vibration mode (bend mode) involving bending deformation with piezoelectric constant d31, and a shear mode utilizing shearing deformation of film.

For the electromechanical transducer element including the PZT film, as described below, pressurization chambers and electromechanical transducer elements can be directly built-in a Si substrate by using technologies of semiconductor processing and micro electro mechanical systems (MEMS). Accordingly, the electromechanical transducer elements can be formed as thin-film piezoelectric actuators to generate pressure in the pressurization chambers.

Figure 2:
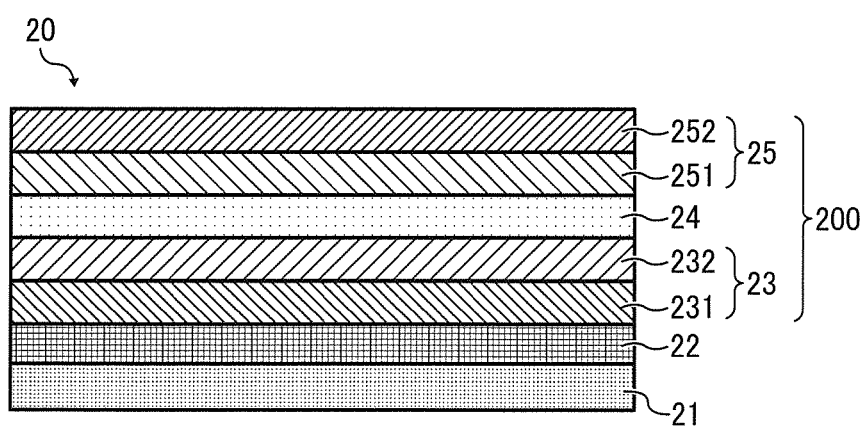
FIG. 2 is a cross-sectional view of another example of the configuration of an electromechanical transducer element according to an embodiment of the present disclosure.

FIGS. 1 and 2 are cross-sectional views of schematic configurations of piezoelectric actuators including electromechanical transducer elements according to embodiments of the present disclosure.

In a configuration example of FIG. 1, a piezoelectric actuator 20 includes a substrate 21, a diaphragm 22, and an electromechanical transducer element 200 that are laminated in this order from the bottom thereof. The electromechanical transducer element 200 includes a lower electrode 23, an electromechanical transducer film 24, and an upper electrode 25. The lower electrode 23 as a first electrode is disposed above the diaphragm 22 with the diaphragm 22 interposed in between. The electromechanical transducer film 24 is disposed on the lower electrode 23. The upper electrode 25 as a second electrode is disposed on the electromechanical transducer film 24.

The lower electrode 23 includes an electrode layer made of, e.g., a metal layer disposed directly under a lower face as a first surface of the electromechanical transducer film 24 or below the lower face of the electromechanical transducer film 24 with an intervening layer, such as a base layer, in between. The upper electrode 25 includes an electrode layer made of, e.g., a metal layer disposed directly on an upper face as a second surface of the electromechanical transducer film 24 or below the upper face of the electromechanical transducer film 24 with an intervening layer, such as a base layer, in between. Applying a voltage between the lower electrode 23 and the upper electrode 25 allows formation of an electric field in a film thickness direction of the electromechanical transducer film 24.

Here, each of the lower electrode 23 and the upper electrode 25 may be, e.g., a combination of a metal layer having a sufficiently small electric resistance and an oxide electrode layer having conductivity. For example, in a configuration example of FIG. 2, the lower electrode 23 includes a metal layer 231 and an oxide electrode layer 232 laminated on the metal layer 231. The metal layer 231 is disposed at a side closer to the diaphragm 22 and the oxide electrode layer 232 is disposed at a side closer to the electromechanical transducer film 24. The upper electrode 25 includes an oxide electrode layer 251 and a metal layer 252 laminated on the oxide electrode layer 251. The oxide electrode layer 251 is disposed at a side closer to the electromechanical transducer film 24. The oxide electrode layer 232 and the oxide electrode layer 251 are advantageous in suppressing a reduction in the amount of deformation (the amount of surface displacement) of the electromechanical transducer element 200 in continuous driving as the piezoelectric actuator. Each of the oxide electrode layer 232 and the oxide electrode layer 251 may be a seed layer made of, for example, lead titanate (PT). Such a configuration more reliably suppresses a reduction in the amount of deformation (the amount of displacement of a surface) of the electromechanical transducer element 200.

Figure 3A:
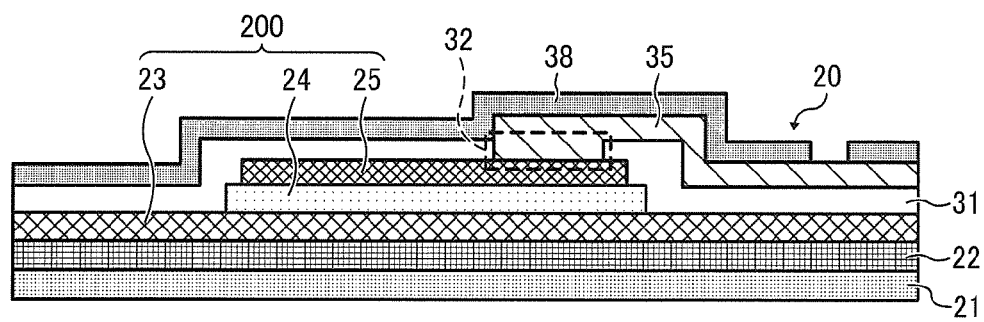
FIG. 3A is a cross-sectional view of a schematic configuration example of an electromechanical transducer element disposed in a droplet discharge head according to an embodiment of the present disclosure.
Figure 3B:
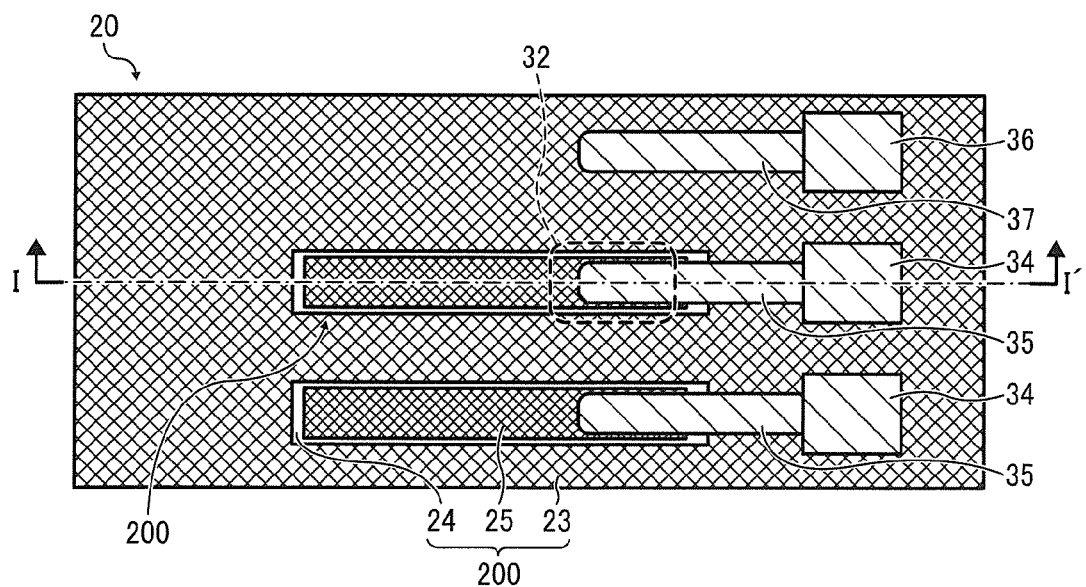
FIG. 3B is a plan view of the electromechanical transducer element of FIG. 3A.

FIGS. 3A and 3B are illustrations of an example of a configuration in which the piezoelectric actuator 20 including the electromechanical transducer element 200 according to an embodiment of the present disclosure is used in, for example, a droplet discharge head. FIG. 3A is a cross-sectional view of a schematic configuration example of the electromechanical transducer element 200 in a droplet discharge head according to an embodiment of the present disclosure. FIG. 3B is a plan view of the electromechanical transducer element 200 of FIG. 3A. Note that, in FIG. 3B, a first insulating protective film (inter-layer insulating film) 31 and a second insulating protective film (inter-layer insulating film) 32 are omitted for ease of understanding of the configuration of the electromechanical transducer element 200. FIG. 3A is a cross-sectional view of the electromechanical transducer element 200 cut along line I-I' of FIG. 3B.

As illustrated in FIG. 3A, the piezoelectric actuator 20 includes the electromechanical transducer element 200. The electromechanical transducer element 200 includes the lower electrode 23, the electromechanical transducer film 24, and the upper electrode 25. As illustrated in FIG. 3B, a plurality of electromechanical transducer elements 200 having such a configuration is arrayed in a predetermined direction along a surface of the substrate 21. The plurality of electromechanical transducer elements 200 is disposed above the substrate 21 with the diaphragm 22 interposed in between.

Any one of the lower electrode 23 and the upper electrode 25 may be configured to be a common electrode shared by the plurality of electromechanical transducer elements 200. In such a configuration, the other of the lower electrode 23 and the upper electrode 25 is configured to be discrete electrodes that are separately disposed corresponding to the respective electromechanical transducer elements 200 and independent from each other. Note that, in the configuration example of FIGS. 3A and 3B, the lower electrode 23 is a common electrode and the upper electrode 25 is configured to be discrete electrodes that are separately disposed corresponding to the respective electromechanical transducer elements 200 and independent from each other.

A first insulating protective film 31 as an inter-layer insulating film is disposed on a predetermined area on the upper electrode 25 and the lower electrode 23. As described below, the first insulating protective film 31 may be made of inorganic compound. At a predetermined position of the first insulating protective film 31, a contact hole 32 is disposed to electrically connect the upper electrode 25 and the lower electrode 23 to other electrodes.

In FIGS. 3A and 3B, each upper electrode 25 as the discrete electrode is connected to a discrete electrode pad 34 to connect an external circuit. The upper electrode (discrete electrode) 25 and the discrete electrode pad 34 are electrically connected with, for example, a connector 35.

In FIGS. 3A and 3B, each lower electrode 23 as the common electrode is connected to a common electrode pad 36 to connect an external circuit. The lower electrode (common electrode) 23 and the common electrode pad 36 are electrically connected with, for example, an inter-pad connector 37.

A second insulating protective film 38 is disposed on the common electrode pad 36 and the discrete electrode pad 34. As described below, the second insulating protective film 38 may be made of inorganic compound. The second insulating protective film 38 includes an opening portion through which each of the common electrode pad 36 and the discrete electrode pad 34 is partially exposed to the outside.

Next, a description is given of a method of performing polarization processing on an electromechanical transducer layer 24 in a production process of the electromechanical transducer element 200 having the above-described configuration.

Figure 4:
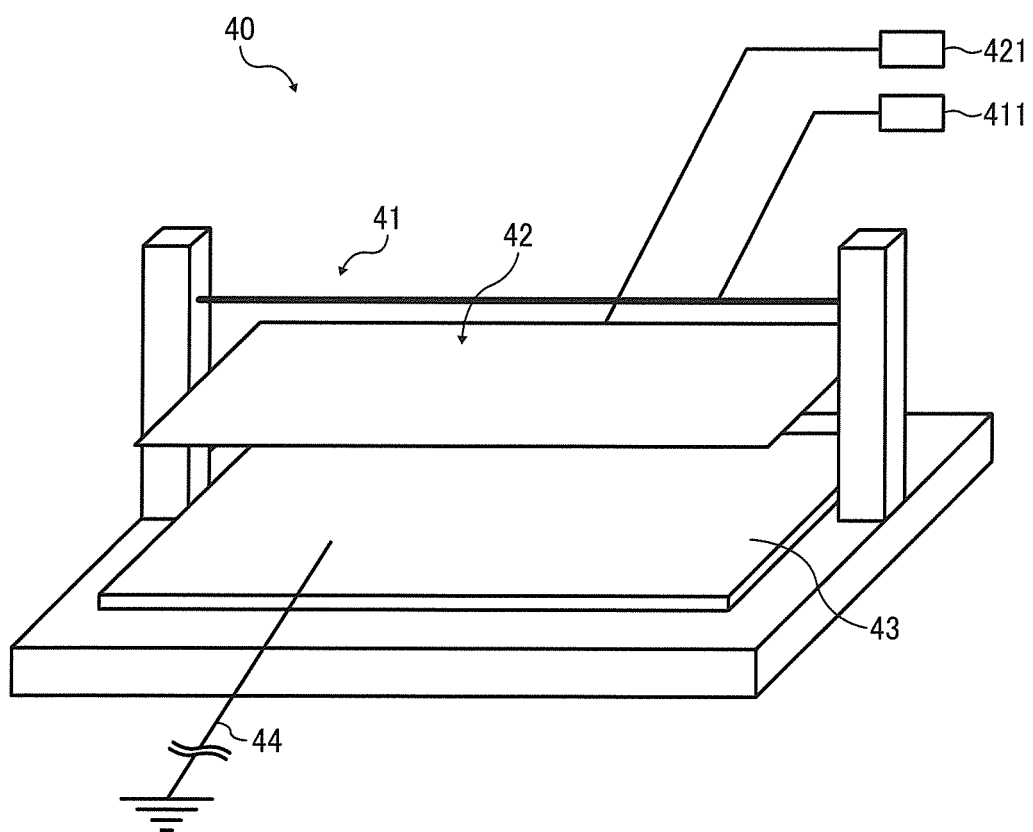
FIG. 4 is a perspective view of a schematic configuration example of a polarization processing device used to perform polarization processing on an electromechanical transducer layer in a production process of an electromechanical transducer element according to an embodiment of the present disclosure.

FIG. 4 is a perspective view of a schematic configuration example of a polarization processing device 40 used to perform polarization processing on an electromechanical transducer layer in a production process of the electromechanical transducer element, according to an embodiment of the present disclosure. In FIG. 4, the polarization processing device 40 includes a corona electrode 41, a grid electrode 42, and a stage 43 including opposed electrodes. The corona electrode 41 and the grid electrode 42 are connected to a corona electrode power supply 411 and a grid electrode power supply 421, respectively. The corona electrode 41 may have, e.g., a shape of wire. The grid electrode 42 is mesh-processed and configured so that, when a high voltage is applied to the corona electrode 41, ion, electric charge, and so on generated by corona discharge effectively fall onto a sample stage. The stage 43 to set a sample thereon may be connected to a ground wire 44 to facilitate electric charge to flow into a sample (the electromechanical transducer element) being a target of electric discharge. The stage 43 may have a temperature adjustment capability to heat the electromechanical transducer element. In such a case, heating temperatures are not limited to a particular range. However, for example, the stage 43 may be configured to heat the electromechanical transducer element to 350° as a maximum temperature.

The magnitude of the voltage applied to each of the corona electrode 41 and the grid electrode 42 and the distance between the sample and each electrode are not limited in particular. For example, to sufficiently perform polarization processing on the sample, the magnitude of the voltage applied to each of the corona electrode 41 and the grid electrode 42 and the distance between the sample and each electrode may be adjusted in accordance with the sample to adjust the intensity of the corona discharge.

FIG. 5 is an illustration of polarization processing in the polarization processing device 40. As illustrated in FIG. 5, if corona discharge is generated with the corona electrode 41 (e.g., corona wire), polarization processing ionizes atmospheric molecules 401, thus generating positive ions. The positive ions generated flow into an electromechanical transducer film through, for example, a common electrode pad and a discrete electrode pad of the electromechanical transducer element 200, thus causing a stage in which electric charge is accumulated in the electromechanical transducer element 200. Accordingly, an internal potential difference is caused by a difference in charge between the upper electrode and the lower electrode, thus causing polarization processing to be performed.

The amount of charge required for the above-described polarization processing is not limited to any particular amount. However, for example, an amount of charge not less than $1.0 \times 10^{-8}$ [C] may be accumulated in the electromechanical transducer element 200. Alternatively, for example, an amount of charge not less than $4.0 \times 10^{-8}$ [C] may be accumulated in the electromechanical transducer element 200. Accumulating an amount of charge in such a range in the electromechanical transducer element 200 allows polarization processing to be performed to more reliably obtain a polarization rate as described later. If the amount of charge accumulated is less than $1.0 \times 10^{-8}$ [C], a sufficiently property might not be obtained as for the deterioration of displacement after continuous driving of the electromechanical transducer element.

The state of polarization processing of the electromechanical transducer element 200 can be determined from a P-E hysteresis loop of the electromechanical transducer element 200.

Figure 6A:
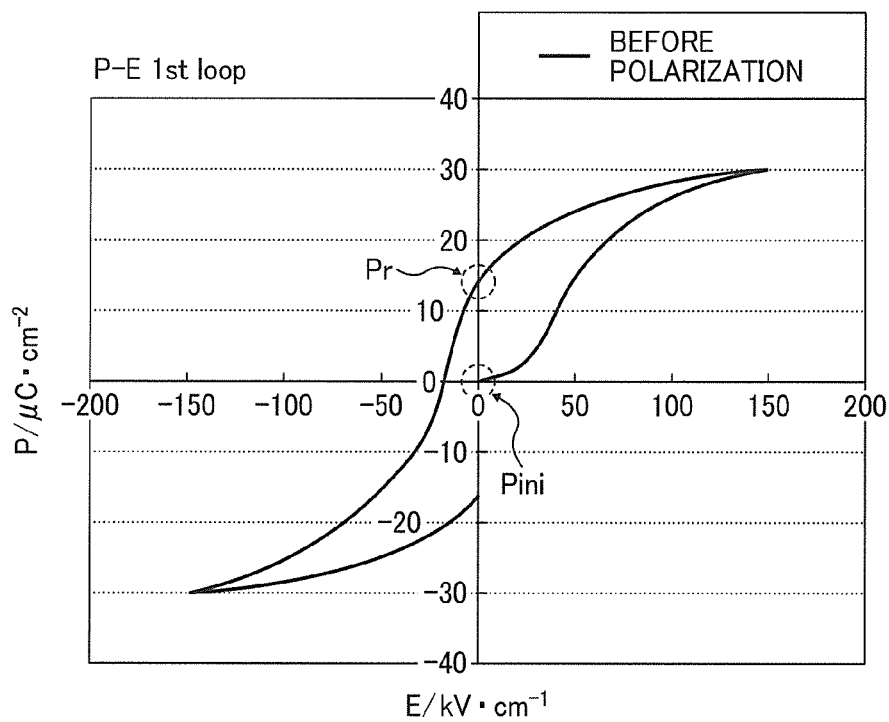
FIG. 6A is a characteristic diagram of a measurement example of a P-E hysteresis loop of the electromechanical transducer element before polarization processing.
Figure 6B:
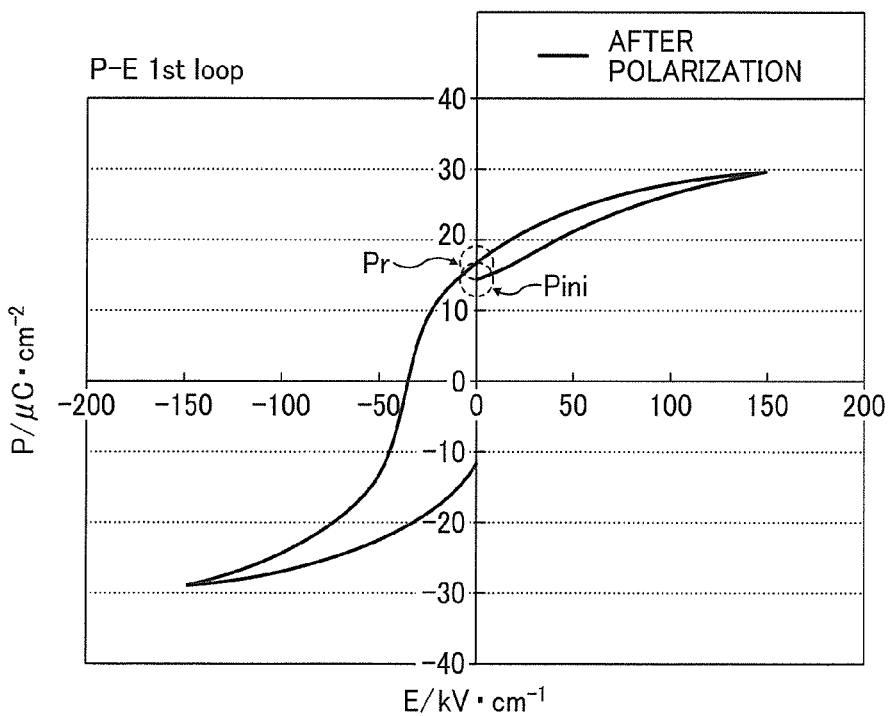
FIG. 6B is a characteristic diagram of a measurement example of a P-E hysteresis loop of the electromechanical transducer element after polarization processing.

FIGS. 6A and 6B are graphs of examples of P-E hysteresis loop to determine the state of polarization processing of the electromechanical transducer element 200. FIG. 6A is a characteristic diagram of an example of P-E hysteresis loop of the electromechanical transducer element 200 before polarization processing is performed. FIG. 6B is a characteristic diagram of an example of P-E hysteresis loop of the electromechanical transducer element 200 after polarization processing is performed.

As illustrated in FIGS. 6A and 6B, when hysteresis loop is measured with an intensity of electric field of ±150 kV/cm applied to the electromechanical transducer element 200 by application of voltage, Pini represents a polarization at 0 kV/cm before application of voltage to the electromechanical transducer element 200. Pr represents a polarization at 0 kV/cm when the intensity of electric field is returned to 0 kV/cm after a voltage of 150 kV/cm is applied to the electromechanical transducer element 200. Here, the value of Pr-$Pini$ is defined as "polarization rate". Based on the polarization rate, it can be determined whether the state of polarization is proper. For example, as illustrated in FIG. 6B, when the value of polarization rate of Pr-Pini measured in the electromechanical transducer element 200 after polarization processing is not greater than a predetermined value, it can be determined that the state of polarization is proper. For example, when the value of polarization rate of Pr-Pini is not greater than 10 $\mu C/cm^2$, it can be determined that the state of polarization is proper. Alternatively, when the value of polarization rate of Pr-Pini is not greater than 5 $\mu C/cm^2$, it can be determined that the state of polarization is proper. When the value of Pr-Pini is not sufficiently small, polar-ization is not sufficiently performed, thus causing a state in which the amount of deformation (the amount of surface displacement) of the electromechanical transducer element 200 relative to a predetermined drive voltage is unstable. In addition, degradation of the amount of deformation (the amount of surface displacement) of the electromechanical transducer element after continuous driving may not be sufficiently suppressed.

Next, a description is given of an example of components of the electromechanical transducer element 200 according to this embodiment. As described above, the electromechanical transducer element 200 according to this embodiment is formed above the substrate 21 with the diaphragm 22 interposed in between.

Materials of the substrate 21 are not limited to any particular materials. However, in consideration of ease of processing, availability, and so on, for example, a monocrystalline silicon substrate is preferably used as the substrate 21. There are three types of plane orientation of {100}, {110}, and {111} for such a monocrystalline silicon substrate. The plane orientation is not limited to any one but a proper substrate is selectable in accordance with the content of processing.

For example, when the substrate 21 is processed by etching, a substrate having a predetermined plane orientation is selectable in accordance with the content of etching. Taking an example of producing a droplet discharge head described later, generally, a substrate is processed by etching to form a pressurizing chamber. In such a case, as a method of etching, typically, anisotropic etching is employed. Anisotropic etching utilizes properties in which the etching rage is different between plane orientations of a crystal structure. For example, in the anisotropic etching in which the substrate is immersed in an alkaline solution, such as KOH, the etching rate of a {111} plane is about ¹⁄₄₀₀ of the etching rate of a {100} plane. Therefore, a structure having an inclination of about 54° can be produced in the plane orientation {100}. On the other hand, a deep groove can be formed in the plane orientation {110}, thus an array density to be increased while rigidity is maintained. Accordingly, for example, for a substrate constituting a droplet discharge head, a monocrystalline silicon substrate having a {110} plane orientation is preferably used.

The thickness of the substrate 21 is selectable in accordance with usage and so on and is not limited to any particular range. However, for example, the thickness of the substrate 21 may be 100 μm to 600 μm.

When the diaphragm 22 constitutes the droplet discharge head described later, the diaphragm 22 as a base film receives a force generated by the electromechanical transducer element 200 and deforms (the surface of the diaphragm 22 deforms) to discharge droplets of ink from a pressure chamber. Accordingly, the base film may have a predetermined strength. As the materials of the diaphragm 22, for example, Si, $SiO_2$, and $Si_3N_4$ are prepared according to a chemical vapor deposition (CVD) method. Further, a material may be selected having a linear expansion coefficient close to a linear expansion coefficient of at least one of the lower electrode 23 and the electromechanical transducer film 24 illustrated in FIG. 1. As a material of the electromechanical transducer film 24, in which PZT is typically used, the diaphragm 22 may be made of a material having a linear expansion coefficient of from $5 \times 10^{-6}$ to $10 \times 10^{-6}$ close to a linear expansion coefficient of $8 \times 10^{-6}$ (1/K). Alternatively, for example, the diaphragm 22 may be made of a material having a linear expansion coefficient of from $7 \times 10^{-6}$ to $9 \times 10^{-6}$. Examples of the material of the diaphragm 22 include aluminum oxide, zirconium oxide, iridium oxide, ruthenium oxide, tantalum oxide, hafnium oxide, osmium oxide, rhenium oxide, rhodium oxide, palladium oxide, and compounds of the foregoing materials. With such materials, the diaphragm 22 is produced by a spin coater using a sputtering method or a sol-gel method. The film thickness of the diaphragm 22 may be in a range of from 0.1 µm to 10 µm or in a range of from 0.5 µm to 3 µm. If the film thickness is smaller than such a range, the processing on the pressure chamber may not be easily performed. By contrast, if the film thickness is greater than such a range, the diaphragm 22 is unlikely to deform as the base film. When the diaphragm 22 is used in a droplet discharge apparatus, the discharge of droplets (ink droplets) might be unstable.

The lower electrode 23 and the upper electrode 25 are not limited to any particular materials but any proper materials are selectable. For example, the lower electrode 23 and the upper electrode 25 may be made of a metal film and an oxide electrode film, or in particular, may be made of a laminate of a metal film and an oxide electrode film. As illustrated in FIG. 2, the lower electrode 23 and the upper electrode 25 may include the metal layer 231 and the metal layer 252, respectively, of sufficiently small electric resistances. Examples of a metal material of the metal layer 231 and the metal layer 252 include platinum having high heat-resistance and low reactivity. However, platinum may not have a sufficient barrier property against lead. Accordingly, platinum group elements, such as iridium and platinum-rhodium, or alloy films thereof may be used for the metal layer 231 and the metal layer 252. When platinum is used, adhesion of platinum with a base (in particular, $SiO_2$) is poor. Therefore, for example, Ti, $TiO_2$, Ta, $Ta_2O_5$, or $Ta_3N_5$ is preferably laminated in advance as an intervening layer. Examples of a method of producing the metal electrode film include a sputtering method and a vacuum vapor deposition method. The film thickness may be set in a range of from 0.05 µm to 1 µm or a range of from 0.1 µm to 0.5 µm.

As illustrated in FIG. 2, the lower electrode 23 and the upper electrode 25, respectively, may include the oxide electrode layer 232 and the oxide electrode layer 251 each having conductivity at an interface with the electromechanical transducer film 24. Examples of a material of the oxide electrode layer 232 and the oxide electrode layer 251 include $SrRuO_3$ and $LaNiO_3$. The method of film formation of the oxide electrode layer 232 and the oxide electrode layer 251 is not limited to any particular method. For example, the oxide electrode layer 232 and the oxide electrode layer 251 may be formed by a sputtering method.

The oxide electrode layer 232 constituting the lower electrode 23 affects the control of orientation of the electromechanical transducer film 24 (the PZT film). Accordingly, materials to be selected are different in accordance with the preferential orientation. In this embodiment, since the plane orientation of the PZT film to be preferentially oriented is {100} plane, the PZT film may be formed after a seed layer made of $LaNiO_3$, $TiO_2$, or $PbTiO_3$ as the oxide electrode layer 232 is formed on the metal layer 231.

An example of a material of the oxide electrode layer 251 constituting the upper electrode 25 is SRO. The film thickness of the oxide electrode layer 251 may be in a range of from 20 nm to 80 nm or in a range of from 30 nm to 50 nm. If the film thickness is smaller than such a range, a sufficient characteristic is not obtained in the initial amount of deformation (the amount of surface displacement) or the deterioration characteristic of the amount of deformation (the amount of surface displacement). By contrast, if the film thickness is larger than such a range, a dielectric strength voltage of the subsequently formed PZT film is very low and leakage might occur easily.

An example of a material of the electromechanical transducer film 24 is an oxide including Pb (for example, PZT). Hereinafter, the electromechanical transducer film made of PZT may be referred to as "PZT film". The PZT is a solid solution of lead zirconate ($PbTiO_3$) and titanium acid ($PbTiO_3$) and has a characteristic different according to a ratio of the lead zirconate ($PbTiO_3$) and the titanium acid ($PbTiO_3$). In a composition showing a generally superior piezoelectric characteristic, a ratio of $PbZrO_3$ and $PbTiO_3$ is 53:47. If the composition is represented by a chemical formula, the composition is represented by Pb ($Zr_{0.53}Ti_{0.47}$) $O_3$, generally, PZT (53/47).

Another example of a material of the electromechanical transducer film 24 is barium titanate as a composite oxide other than the PZT. In such a case, barium alkoxide and titanium alkoxide compounds are used as a starting material and are dissolved in a common solvent, to prepare a barium titanate precursor solution.

In this embodiment, an example is described in which the electromechanical transducer film 24 is made of PZT and the {100} plane of PZT is preferentially oriented. In such a case, the composition ratio of Zr and Ti, that is, Ti/(Zr+Ti) may be set in a range of not less than 0.45 (45%) and not greater than 0.55 (55%) or in a range of not less than 0.48 (48%) and not greater than 0.52 (52%).

The method of producing the electromechanical transducer film 24 is not limited to any particular method. For example, the electromechanical transducer film 24 may be produced by a spin coater using, for example, a sputtering method or a sol-gel method In any case, patterning is performed by, for example, photolithoetching to obtain a desired pattern.

When the sol-gel method is used, the electromechanical transducer film (the PZT film) 24 is produced according to, for example, the following procedure. For example, lead acetate, zirconium alkoxide, and titanium alkoxide compound are used as starting materials and are dissolved in methoxyethanol as a common solvent to obtain a uniform solution. Thus, a PZT precursor solution can be prepared. Since a metal alkoxide compound is easily hydrolyzed by atmospheric water, a stabilizer, such as acetylacetone, acetic acid, or diethanolamine may be appropriately added to the PZT precursor solution.

When the PZT film is formed on an entire surface of the base substrate in which, e.g., the lower electrode is formed, the PZT film is obtained by forming a coating by a solution coating method, such as a spin coating method, and performing each heat treatment of solvent drying, thermal decomposition, and crystallization on the coating. When the coated film is transformed to the crystallized film, the volume of the film contracts. To obtain a crack-free film, the precursor density is preferably adjusted to obtain a film thickness not greater than 100 nm in one-time process.

Alternatively, in the production according to an inkjet method, a patterned film can be obtained by a production flow similar to a production flow of the oxide electrode layer 232. A surface modifier is selected in accordance with a material of the metal layer 231 as a base of the surface modifier. When an oxide is used as the base of the surface modifier, mainly a silane compound is selected as the surface modifier. When a metal is used as the base, mainly alkanethiol is selected.

The film thickness of the electromechanical transducer film 24 is not limited to a particular thickness but is selectable in accordance with the amount of deformation (the amount of surface displacement). For example, the film thickness may be in a range of from 0.5 µm to 5 µm or in a range of from 1 µm to 2 µm. A film thickness in such a range generates a sufficient amount of deformation (the amount of surface displacement). With a film thickness in such a range, the number of steps for laminating layers to form the electromechanical transducer film 24 does not unnecessarily increase, thus allows production with good productivity.

The first insulating protective film 31, the second insulating protective film 38, the connector 35, and the connector 37 are produced, for example, as follows.

the first insulating protective film 31 may be made of a material that is impermeable to moistures in the atmosphere and prevents damage to the electromechanical transducer element 400 in the steps of film formation and etching. Accordingly, for example, dense inorganic material (inorganic compound) may be used. As the first insulating protective film 31, an oxide, nitride, or carbonized film may be used to obtain a high degree of protection performance with a thin film. The first insulating protective film 31 may be made of a material highly adhesive to a material of a base (a material of the upper electrode 25, the lower electrode 23, or the electromechanical transducer film 24) contacting the first insulating protective film 31. Examples of such a material include an oxide film used for ceramic materials, such as $Al_2O_3$, $ZrO_2$, $Y_2O_3$, $Ta_2O_3$, and $TiO_2$ are exemplified.

The method of film formation of the first insulating protective film 31 is not limited to any particular method. For example, as the method, a method of film formation that does not damage the electromechanical transducer element 200 is selected. For example, a vapor deposition method or an atomic layer deposition (ALD) method may be used. In particular, film formation may be performed according to the ALD method that is advantageous in that the number of selectable materials is greater. In particular, according to the ALD method, a thin film with quite high film density is produced, thus reducing damage to the electromechanical transducer element in the production steps.

The film thickness of the first insulating protective film 31 is not limited to any particular thickness. However, the first insulating protective film 31 has a thickness that is large enough to obtain a protection performance of the electromechanical transducer element and is small enough not to hamper the displacement of the electromechanical transducer element. For example, the film thickness of the first insulating protective film 31 may be in a range of not less than 20 nm and not greater than 100 nm. A film thickness greater than 100 nm may hamper the displacement of the electromechanical transducer element 200. By contrast, a film thickness smaller than 20 nm may not provide a sufficient performance as the protective layer of the electromechanical transducer element 200 and the performance of the electromechanical transducer element 200 may decrease.

The first insulating protective film 31 may be constituted of a plurality of layers. For example, when the first insulating protective film 31 is constituted of two layers, to construct the second layer of the insulating protective film relatively thicker, an opening may be formed near the upper electrode in the second layer of the insulating protective film so as not to significantly hamper the vibration displacement of the electromechanical transducer element. As the second layer of the insulating protective film, any oxide, nitride, and carbide or a composite compound thereof can be used. For example, $SiO_2$, which is typically used in a semiconductor device, may be used. The film formation may be any suitable method. For example, the CVD method or sputtering method may be used for film formation. In particular, if the step coating of a pattern forming part, such as an electrode forming part, is considered, the CVD method capable of isotropically forming a film may be used. The film thickness of the second layer of the insulating protective film is not limited to any particular film thickness. In consideration of the voltage applied to each electrode, a film thickness not dielectrically broken down is selectable. For example, the electric field intensity applied to the insulating protective film is set in a range in which the insulating protective film is not dielectrically broken down. In consideration of the surface properties or pin holes of the base of the insulating protective film, the film thickness may be not less than 200 nm or may be not less than 500 nm.

Materials of the connector 35 and the connector 37 are not limited to any particular materials but various types of conductive materials are usable. For example, each of the connector 35 and the connector 37 may be made of any metal electrode material selected from Cu, Al, Au, Pt, Ir, Ag alloy, and Al alloy.

The method of producing the connector 35 and the connector 37 is not limited to any particular method but any particular method can be used. The connector 35 and the connector 37 are produced by, for example, the sputtering method or the spin coating method and a desired pattern is obtained by, for example, photolithographic etching.

The film thickness of each of the connector 35 and the connector 37 is not limited to any particular thickness but may be, for example, in a range of not less than 0.1 µm and not greater than 20 µm or in a range of not less than 0.2 µm and not greater than 10 µm. If the film thickness is smaller than a film thickness in such a range, resistance increases and may hamper a sufficient current from flowing to the electrode. If the film thickness is greater than a film thickness in such a range, it takes a longer time in the production process and may reduce the productivity.

When the first insulating protective film 31 is provided, a contact hole portion for the connector 35 and the connector 37 is disposed in the first insulating protective film 31 so that the connector 35 and the connector 37 are connected to the common electrode and the discrete electrode. The dimension of the contact hole portion is not limited to any particular size but may be, for example, 10 µm×10 µm. As the contact resistance of the contact hole portion, the common electrode may have a contact resistance of, for example, not greater than 10Ω and the discrete electrode may have a contact resistance of, for example, not greater than 1Ω. Such a range allows stable supply of a sufficient current to each electrode. Alternatively, the common electrode may have a contact resistance of not greater than 5Ω and the discrete electrode may have a contact resistance of not greater than 0.5Ω. With a contact resistance greater than such a range, when the electromechanical transducer element 200 is used in the droplet discharge head (see FIG. 12), a sufficient electric current may not be supplied and may cause a failure in discharging droplets.

The second insulating protective film 38 is a passivation layer having a function of protecting the connector 35 and the connector 37. The second insulating protective film 38 covers the connector 35 and the connector 37, except for areas of the discrete electrode pad 34 and the common electrode pad 36. Even when low cost Al or an alloy material including Al as main ingredient is used for the connector 35 and the connector 37, such a configuration enhances the reliability of the electromechanical transducer element 200. In addition, since low cost materials are used for the connector 35 and the connector 37, the cost of the electromechanical transducer element 200 is reduced.

The material of the second insulating protective film 38 is not limited to any particular material but any inorganic material or any organic material can be used. For example, a material with low moisture permeability may be used. Examples of inorganic material include oxide, nitride, and carbide. Examples of organic material include polyimide, acrylic resin, and urethane resin. However, for organic material, to function as the insulating protective film, the film thickness may be relatively thick and patterning may not be easily performed. Accordingly, an inorganic material may be used that can show a function of protecting wiring in a thin film. When Al wiring is used as the connector 35 and the connector 37, for example, $Si_3N_4$, which is widely used in semiconductor devices, may be used as the second insulating protective film.

The film thickness of the second insulating protective film 38 may be, for example, not less than 200 nm or not less than 500 nm. If the film thickness is smaller than such a range, a sufficient passivation performance is not obtained. For example, breaking due to corrosion of the connector may cause a reduction in reliability.

The second insulating protective film 38 may have openings above the electromechanical transducer elements 200. When the electromechanical transducer element 200 is applied to the droplet discharge head, the second insulating protective film 38 may have openings above the diaphragm. Such a configuration allows the electromechanical transducer element to be more efficient and have higher reliability.

The second insulating protective film 38 may have openings to expose the common electrode pad 36 and the discrete electrode pad 34. The openings are formed by, for example, a photolithography method or dry etching.

The area of each of the common electrode pad 36 and the discrete electrode pad 34 is not limited to any particular size. When polarization processing is performed after formation of the common electrode pad 36, the discrete electrode pad 34, and the second insulating protective film 38, electric charge is supplied from each of the common electrode pad 36 and the discrete electrode pad 34. Therefore, for example, the area of each of the common electrode pad 36 and the discrete electrode pad 34 may be set to such a size that polarization processing is fully performed. For example, each of the common electrode pad 36 and the discrete electrode pad 34 may have not less than a size of 50 μm×50 μm or may have not less than a size of 100 μm×300 μm. If the area of the common electrode pad 36 and the discrete electrode pad 34 is smaller than the above-described range, polarization processing may not be sufficiently performed and the degree of degradation of the amount of deformation (the amount of surface displacement) may increase over time after continuous driving.

Next, a description is given of a relationship between crystal orientation of the electromechanical transducer film (PZT film) 24 and properties as the electromechanical transducer element 200 in this embodiment.

Note that, in the present disclosure, the term {hkl} plane is representative of an (hkl) plane and a plurality of crystal planes equivalent to the (hkl) plane from a symmetry without considering a direction of voluntary polarization in crystallization of a piezoelectric material. The {hkl} plane may be any one crystal plane of the (hkl) plane and the plurality of crystal planes equivalent to the (hkl) plane or any two or more crystal planes selected from the (hkl) plane and the plurality of crystal planes equivalent to the (hkl) plane.

For example, in a piezoelectric body having a crystal structure of perovskite, the term {111} plane represents any one plane or any two or more crystal planes of a plurality of crystal planes including a (111) plane and other seven crystal planes equivalent to the (111) plane. The term {100} plane represents any one plane or any two or more crystal planes of a plurality of crystal planes including a (100) plane and other five crystal planes equivalent to the (100) plane.

In the present disclosure, the term {hlk} orientation represents that the {hkl} plane is oriented perpendicular to a thickness direction of the film. The term (hlk) orientation represents that the (hkl) plane is oriented perpendicular to the thickness direction of the film. For example, the terms {100} orientation represents that the {100} plane is oriented perpendicular to the thickness direction of the film. The term {111} orientation represents that the {111} plane is oriented perpendicular to the thickness direction of the film. The term {200} orientation represents that the {200} plane is oriented perpendicular to the thickness direction of the film.

In the present disclosure, the "orientation rate" of a particular crystal plane oriented perpendicular to the thickness direction of the electromechanical transducer film is defined by the following measurement. That is, θ-2θ scanning measurement according to an X-ray diffraction (XRD) method is performed on the electromechanical transducer film. Then, the area of a peak corresponding to the particular crystal plane observed on a 2θ spectrum curve and the area of each of all peaks or main peaks observed on the 2θ spectrum curve are determined. The "orientation rate" of the particular crystal plane is represented by a percentage of a value obtained by dividing the area of the peak corresponding to the particular crystal plane by a sum of the areas of all peaks or main peaks.

In the present disclosure, the degree of orientation ρ{hkl} of the {hkl} plane of the electromechanical transducer film is defined by the formula of ρ{hkl}=I{hkl}/ΣI{hkl}. Here, I{hkl} is a peak intensity of a diffraction peak derived from a given {hkl} plane obtained by the θ-2θ scanning measurement of the X-ray diffraction (XRD) method on the electromechanical transducer film. ΣI{hkl} is a total sum of peak intensities of a plurality of diffraction peaks obtained by the θ-2θ scanning measurement of the X-ray diffraction (XRD) method on the electromechanical transducer film.

Figure 7:
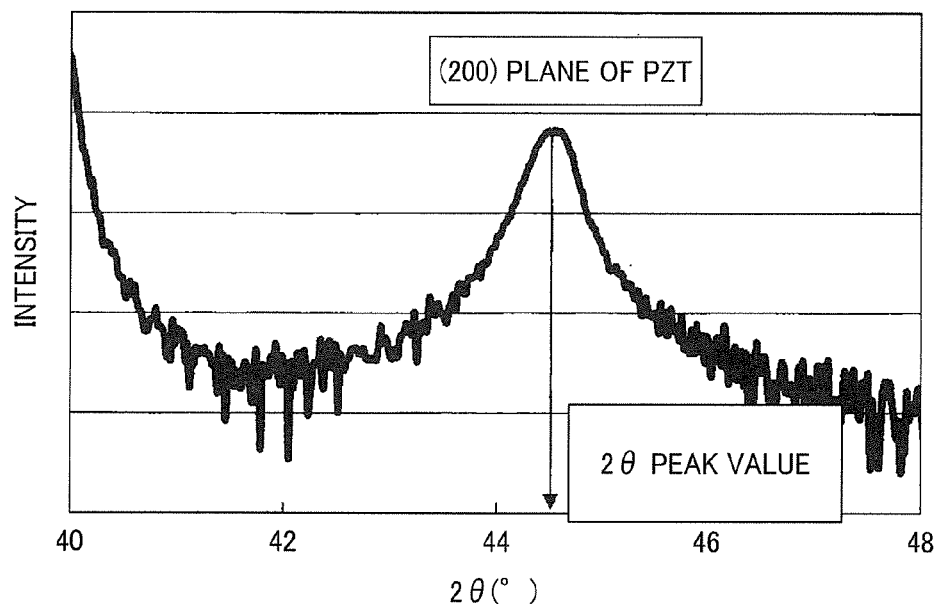
FIG. 7 is a graph of diffraction peak position on {200} plane of an electromechanical transducer film (PZT film) obtained by a θ-2θ scanning measurement according to an X-ray diffraction method.

FIG. 7 is a graph of diffraction peak position on {200} plane of the electromechanical transducer film (the PZT film) obtained by the θ-2θ scanning measurement of the X-ray diffraction (XRD) method. In FIG. 7, the horizontal axis represents the value of 2θ in the θ-2θ scanning measurement of the X-ray diffraction (XRD) method. The vertical axis represents the diffraction intensity measured at each 2θ. Through experiments and considerations, the present inventors have found that, as the composition ratio of Zr/Ti in PZT changes, as illustrated in FIG. 7, the 2θ peak position (diffraction peal position) corresponding to the {200} plane of the PZT film (hereinafter, referred to as "PZT {200} plane") and the peak asymmetry also change. From the results, by adjusting various parameters in the production process so that the 2θ peak position and the peak asymmetry of the PZT {200} plane at a high angle side be preferable, the amount of deformation (the amount of surface displacement) is obtained that preferably maintains droplet discharge properties when the electromechanical transducer film is used for the droplet discharge head.

For the diffraction peak position of the PZT {200} plane, 2θ may be in a range of not less than 44.50° and not greater than 44.80° or may be in a range of 44.65° and not greater than 44.75° in a state in which the PZT film is constrained by a base substrate.

When the droplet discharge head is formed (see FIG. 12), the formation is performed in a state in which liquid chambers are formed and the PZT film is not constrained by the base substrate. In such a case, since the crystal lattice extends in a vertical direction to a plane of the substrate, the diffraction peak position (2θ) of the PZT {200} plane is smaller. For the diffraction peal position of the PZT {200} plane, for example, 2θ may be in a range of not less than 44.45° and not greater than 44.75° or may be in a range of 44.55° and not greater than 44.70° in a state in which the PZT film is not constrained by the base substrate.

If the composition ratio of Zr/Ti in PZT is smaller than the above-described range or the 2θ position (diffraction peal position) of the PZT {200} plane is smaller than the above-described range, the amount of deformation (the amount of surface displacement) accompanying a rotational distortion described later decreases. Accordingly, the amount of deformation (the amount of surface displacement) of the electromechanical transducer element 200 may not be sufficiently obtained. By contrast, if the composition ratio of Zr/Ti in PZT is greater than the above-described range or the PZT {200} plane (diffraction peal position) of the PZT {200} plane is greater than the above-described range, the amount of deformation (the amount of surface displacement) accompanying a rotational distortion also decreases. Accordingly, the amount of deformation (the amount of surface displacement) of the electromechanical transducer element 200 may not be sufficiently obtained.

Figure 8:
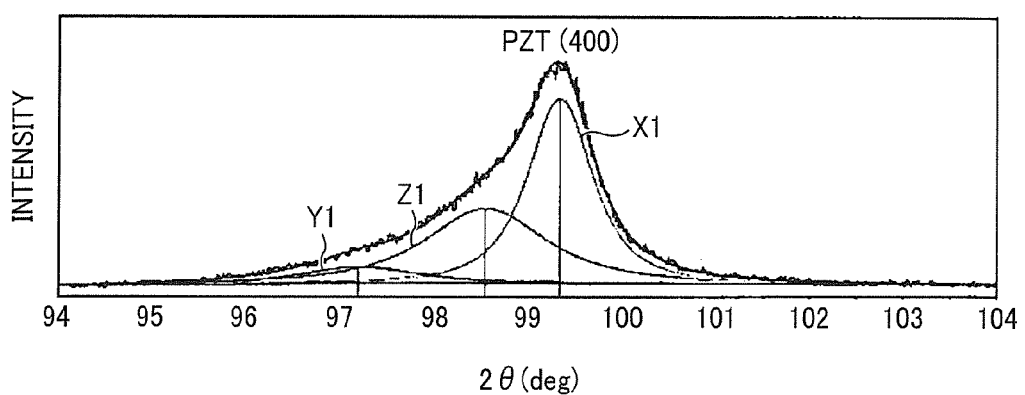
FIG. 8 is a graph of results of peak separation performed focusing on diffraction peaks derived from {400} plane of the electromechanical transducer film (PZT film) obtained by the θ-2θ scanning measurement according to the X-ray diffraction (XRD) method.

FIG. 8 is a graph of results of peak separation performed focusing on diffraction peaks derived from {400} plane of the electromechanical transducer film (the PZT film) obtained by the θ-2θ scanning measurement of the X-ray diffraction (XRD) method. In FIG. 8, the horizontal axis represents the value of 2θ in the θ-2θ scanning measurement of the X-ray diffraction (XRD) method. The vertical axis represents the diffraction intensity measured at each 2θ.

Focusing on a diffraction peak derived from the {400} plane, a peak separation is performed on an electromechanical transducer film (PZT film) having a 2θ position (diffraction peal position) adjusted within the above-described predetermined range by the above-described composition ratio of Zr/Ti, to identify the attribution state of the crystal structure.

A great degree of asymmetry of the diffraction peak illustrated in FIG. 8 attributes to any one of three crystal structures. Specifically, such a great degree of asymmetry attributes to three crystal structures: a tetragonal a-domain structure X1, a tetragonal c-domain structure Y1, and a mixed structure Z1 of any one of a rhombohedral structure, an orthorhombic structure, and a pseudo-cubic structure.

Here, the tem' "a-domain" represents a domain in which, of a plurality of types of domains included in a perovskite crystal (PZT crystal) of an electromechanical transducer film (PZT film), an a-axis of the perovskite crystal (PZT crystal) is parallel to a film thickness direction of the electromechanical transducer film. Here, the term "c-domain" represents a domain in which a c-axis (spontaneous polarization axis) of the perovskite crystal (PZT crystal) is parallel to the film thickness direction. The term "a-domain structure" represents the crystal structure of a-domain. The term "c-domain structure" represents the crystal structure of c-domain.

In the above-described crystal structures, in the ratio of the tetragonal a-domain structure X1 and the tetragonal c-domain structure Y1, for a plurality of diffraction peak areas separated, Sa represents the diffraction peak area attributing to the tetragonal a-domain structure X1 and Sc represents a diffraction peak area attributing to the tetragonal c-domain structure Y1. In this embodiment, the percentage of the diffraction peak area Sc in the sum of the diffraction peak area Sa attributing to the a-domain structure X1 and the diffraction peak area Sc attributing to the c-domain structure Y1, Sc/(Sa+Sc), may be not greater than 20% or may be not greater than 18%. If the percentage of Sc/(Sa+Sc) is greater than the above-described range, cracks are likely to occur in the above-described step of polarization processing, thus hampering polarization processing under a condition of strong electric field. Accordingly, the amount of deformation (the amount of surface displacement) in continuous driving is likely to degrade over time.

In addition, Sb represents a diffraction peak area attributing to any one of a rhombohedral structure, an orthorhombic structure, and a pseudo-cubic structure. In this embodiment, the percentage of the diffraction peak area Sc in the sum of the diffraction peak area Sa attributing to the a-domain structure X1, the diffraction peak area Sc attributing to the c-domain structure Y1, and the diffraction peak area Sb, Sc/(Sa+Sc+Sb), may be not greater than 18% or may be not greater than 15%. If the percentage of Sc/(Sa+Sc+Sb) is greater than the above-described range, cracks are likely to occur in the above-described step of polarization processing, thus hampering polarization processing under a condition of strong electric field. Accordingly, the amount of deformation (the amount of surface displacement) in continuous driving is likely to degrade over time.

Figure 9A:
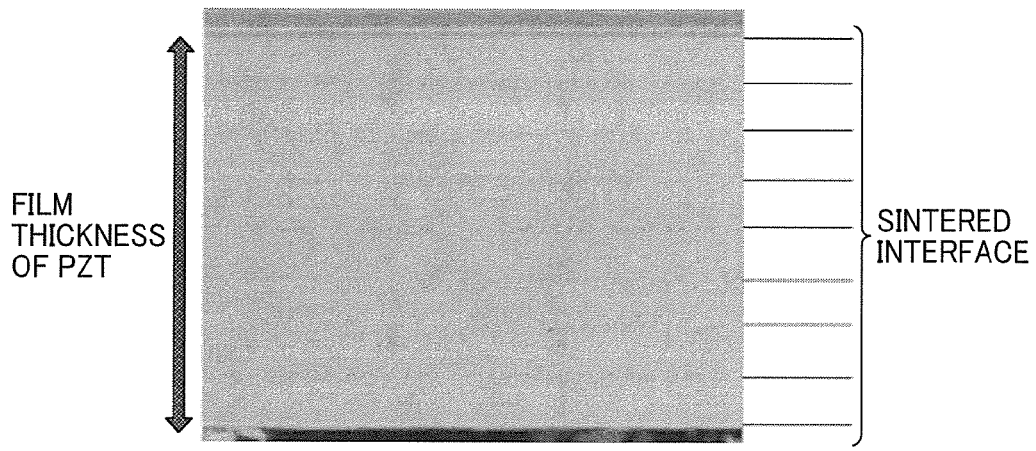
FIG. 9A is a cross-sectional view of an example of the configuration of an electromechanical transducer element according to an embodiment of the present disclosure.
Figure 9B:
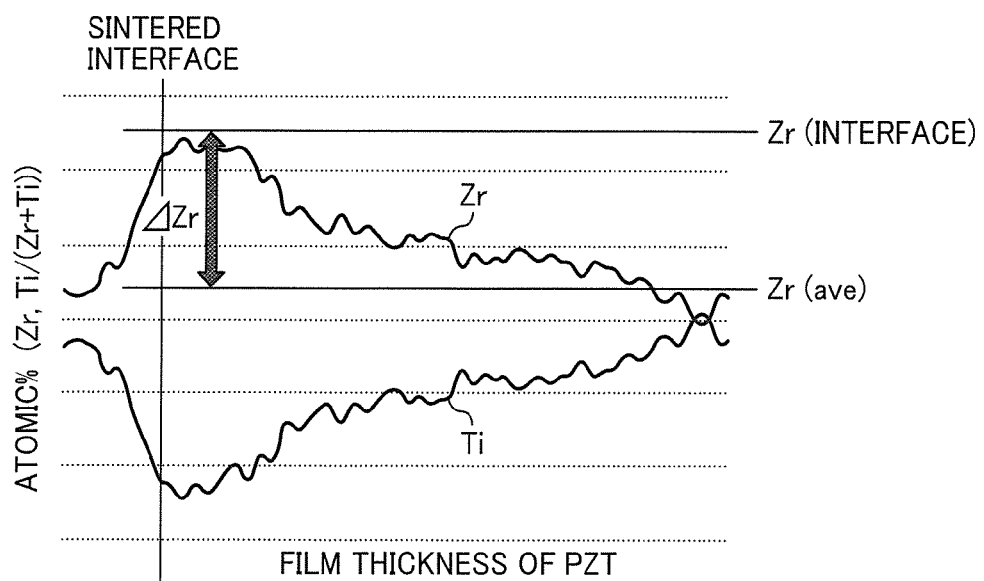
FIG. 9B is a graph of an example of the variation ratio of Zr of a sintered interface.

FIGS. 9A and 9B are illustrations of variation ratio of Zr of a sintered interface of the electromechanical transducer film according to this embodiment (hereinafter, "lamination interface"). FIG. 9A is a cross-sectional view of an example of the sintered interface of the electromechanical transducer film FIG. 9B is a graph of the variation ratio of Zr of the sintered interface.

The ratio of the tetragonal a-domain structure and the tetragonal c-domain structure affects the above-described composition ratio of Zr/Ti and is also affected by the amount of boundary segregation of Zr generated in the sintered interface of the electromechanical transducer film (PZT film) as illustrated in FIGS. 9A and 9B. In this embodiment, when film formation of the electromechanical transducer film (PZT film) is performed from a solution process, a precursor-film creation step to create a PZT precursor film and a sintering step for crystallization are repeated to obtain a predetermined film thickness. At this time, a tendency of segregation of Zr is observed in a composition profile near the sintered interface crystalized. The ration of the tetragonal a-domain structure and the tetragonal c-domain structure changes with the amount of segregation.

As the definition of the amount of segregation of Zr, Zr(ave) represents Zr/(Zr+Ti), an atomic weight ratio of Zr entirely contained in the electromechanical transducer film (PZT film) formed in a predetermined thickness. In addition, Zr(interface) represents Zr/(Zr+Ti), an atomic weight ratio of Zr at a lamination interface of the above-described plurality of thin films constituting the electromechanical transducer film (PZT film). Where ΔZr represents the variation ratio of Zr at the lamination interface, the value of ΔZr=Zr(interface)−Zr(ave) may be not greater than 20% or may be not greater than 10%. If the variation ratio ΔZr is greater than the above-described range, cracks are likely to occur in the above-described step of polarization processing, thus hampering polarization processing under a condition of strong electric field. Accordingly, the amount of deformation (the amount of surface displacement) in continuous driving is likely to degrade over time.

Next, a description is given of a preferential orientation of the electromechanical transducer film (PZT film) 24 according to this embodiment and the degree of orientation (orientation rate) thereof. Here, the term "{100} preferentially oriented" represents that {100} plane of an electromechanical transducer film (PZT film) is more preferentially oriented than any other plane. The term "{111} preferentially oriented" represents that {111} plane of an electromechanical transducer film (PZT film) is more preferentially oriented than any other plane.

Figure 10:
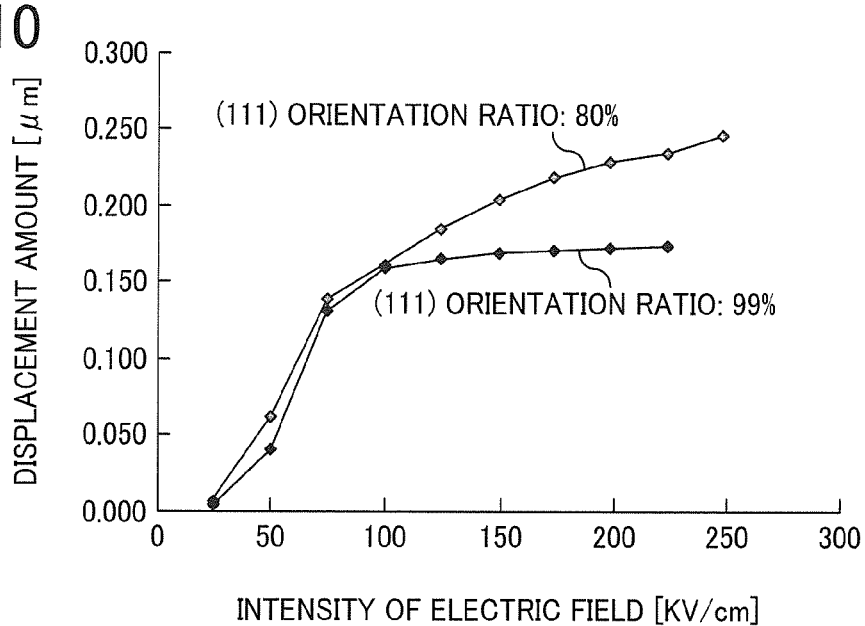
FIG. 10 is a graph of an example of results of an experiment conducted on the relationship between the electric field intensity and the amount of deformation (amount of surface displacement) in two types of {111} orientation degrees differing from each other, in a {111} preferentially-oriented electromechanical transducer film (PZT film)
Figure 11:
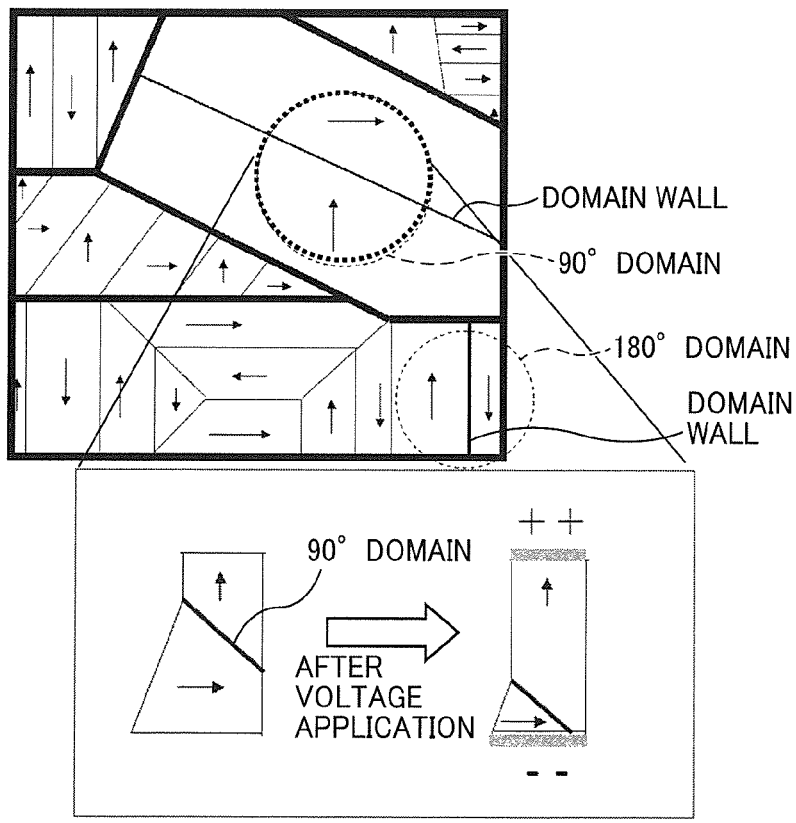
FIG. 11 is an illustration of an example of domains of an electromechanical transducer film (PZT film) and a change of the domains in application of voltage.

FIG. 10 is a graph of an example of results of an experiment conducted on the relationship between the electric field intensity and the amount of displacement in two types of {111} orientation degrees differing from each other, in a {111} preferentially-oriented electromechanical transducer film (PZT film). FIG. 11 is an illustration of an example of domains of the electromechanical transducer film (PZT film) and a change of the domains in application of voltage.

As illustrated in a graph of the {111} orientation degree of 99%, when the {111} orientation degree is extremely high (for example, 95% or greater), the amount of displacement relative to the electric field intensity of the electromechanical transducer film (PZT film) saturates in the middle. Therefore, it was found that a sufficient amount of deformation (amount of surface displacement) was not obtained under high electric field intensities. The inventor thinks that such experiment results are caused by the following mechanism. As illustrated in FIG. 11, the deformation (surface displacement) of the PZT film is obtained by (1) an increase of displacement due to piezoelectric strain and (2) an increase of strain due to domain rotation when voltage is applied. At this time, in a case in which {111} plane of PZT is completely oriented, since the displacement is obtained by only (1) an increase of displacement due to piezoelectric strain with little influence of (2) domain rotation, it seems that the amount of deformation (amount of surface displacement) saturates in the middle.

Here, the term "piezoelectric strain" represents a strain generated by a piezoelectric effect represented by a piezoelectric constant, such as d31, of a piezoelectric body, such as PZT. The term "domain rotation" used herein represents that, when voltage is applied to a piezoelectric body, such as PZT, the crystal structure of domains in the piezoelectric body changes as if the domains rotate. For example, the c-domain of the piezoelectric body, such as PZT, turns into the a-domain or the a-domain turns into the a-domain, so that the crystal structure of domains changes as if the domains rotate 90 degrees From the above-described results, in the PZT film according to this embodiment, {100} plane is preferentially oriented. As described above, the orientation degree ρ{hkl} of {hkl} plane is expressed by the following formula (1):

$$\rho\{hkl\} = I\{hkl\}/\Sigma I\{hkl\} \quad (1)$$

Note that ρ{hkl} represents the degree of orientation of {hkl} plane orientation, I{hkl} represents the peak intensity of a given orientation, and ΣI{hkl} represents a total sum of peak intensities.

In the above-described formula (1), the total sum of peak intensities obtained by the θ-2θ scanning measurement of the X-ray diffraction (XRD) method is 1. The electromechanical transducer film (PZT film) according to this embodiment is a polycrystalline film in which a sum of the orientation degree ρ{110} of {110} orientation and the orientation degree ρ{111} of {111} orientation, which are calculated based on the ratio of peak intensities of the respective orientations, is within a predetermined range. For example, the sum of the orientation degree ρ{110} and the orientation degree ρ{111} of the electromechanical transducer film (PZT film) according to this embodiment is in a range of not less than 0.0002 and not greater than 0.25. In addition, the sum of the orientation degree of {110} orientation and the orientation degree of {111} orientation may be not less than 0.001 and not greater than 0.10. If the sum is smaller than the above-described ranges and, for example, the sum of the orientation degree of {110} orientation and the orientation degree of {111} orientation is close to zero in, e.g., an epitaxial single crystal film or a uniaxial orientation film, a crack is likely to occur in the step of polarization processing, thus hampering polarization processing under strong electric field conditions. Accordingly, the amount of deformation (amount of surface displacement) is more likely to degrade over time in continuous driving. By contrast, if the sum of the orientation degree of {110} orientation and the orientation degree of {111} orientation is greater than the above-described ranges, a sufficient piezoelectric strain is not obtained and a sufficient amount of deformation (amount of surface displacement) is not reliably obtained.

As described above, the electromechanical transducer element 200 according to this embodiment is a {100} preferentially-oriented polycrystalline film in which the orientation degree of {110} orientation and the orientation degree of {111} orientation are slightly mixed in the crystal orientation of the PZT film used as the electromechanical transducer film 24. In addition, Sc/(Sa+Sc) is not greater than 20%, where Sa and Sc represent the areas of diffraction peaks attributing to the tetragonal a-domain structure and the tetragonal c-domain structure, respectively, in the electromechanical transducer film 24. Accordingly, when applied to a droplet discharge apparatus, such as an inkjet recording apparatus (image forming apparatus) described later, the electromechanical transducer element 200 according to this embodiment sufficiently obtains the amount of deformation (amount of surface displacement) preferably maintaining droplet discharge properties and achieves stable droplet discharge properties since degradation of the amount of deformation (amount of surface displacement) is sufficiently suppressed even when droplets are continuously discharged.

In the above-described step of polarization processing, for example, when electric discharge is performed with the above-described polarization processing device 40 illustrated in FIG. 4, no cracks occurs in the electromechanical transducer film (PZT film) 24. Accordingly, polarization processing is reliably performed on, for example, a plurality of electromechanical transducer elements 200 disposed in a droplet discharge head without cracks, thus enhancing the yield.

Next, examples of the electromechanical transducer element 200 according to this embodiment are described with comparative examples. Note that the examples of the electromechanical transducer element 200 are not limited to the following examples.

Example 1

In Example 1, a thermal oxide film (having a film thickness of 1 μm) was formed on a 6-inch silicon wafer as a substrate 21. Then, a lower electrode 23 was formed on the substrate 21. The lower electrode 23 has a structure in which an adhesion layer and a metal electrode film are laminated one on the other.

A titanium film (having a film thickness of 20 nm) was formed at a film formation temperature of 350° C. by a sputtering apparatus and thermal oxidization was performed on the titanium film at 750° C. by rapid thermal annealing (RTA) treatment. Thus, the adhesion layer was formed. Subsequently, as the metal electrode film, a platinum film (having a film thickness of 160 nm) was formed at a film formation temperature of 400° C. by the sputtering apparatus.

Next, a solution (hereinafter, PT solution) prepared in a ratio of amount of substance of Pb:Ti=1:1 as a PbTiO$_3$ layer (hereinafter, PT layer) being a base layer and a PZT precursor solution prepared in a ratio of amount of substance of Pb:Zr:Ti=115:49:51 as an electromechanical transducer film were prepared, and were formed as a film by a spin coating method.

For synthesis of a specific precursor coating liquid, lead acetate trihydrate, titanium isopropoxide, and zirconium isopropoxide were used as starting materials. Crystal water of lead acetate was dissolved in methoxyethanol and was then dehydrated. The amount of lead is excessively large for a stoichiometric composition. This is to prevent reduction in crystallinity by so-called lead missing during heat treatment. The titanium isopropoxide and the zirconium isopropoxide were dissolved in methoxyethanol, an alcohol exchange reaction and an esterification reaction were advanced, a resultant was mixed with a methoxyethanol solution having dissolved the lead acetate, and the PZT precursor solution was synthesized. A concentration of the PZT in the PZT precursor solution was 0.5 [mol/l]. The PT solution was prepared in the same manner as the PZT precursor solution.

Next, first, using the PT solution, the PT layer was formed by spin coating and drying was performed at 120° C. Then, a film was formed by spin coating method using the PZT precursor solution, and 120° C. dry and 400° C. thermal decomposition were performed on the film. Then, the steps of film formation, drying, and thermal decomposition were repeated to form a lamination film. After a thermal decomposition process was executed on a third layer, crystallization heat treatment (temperature of 730° C.) was executed by rapid thermal annealing (RTA). At this time, a film thickness of the PZT was 240 nm. The steps were repeated eight times. In other words, a total of 24 layers were laminated, and an electromechanical transducer film 24 having a film thickness of about 2 μm was obtained.

Next, an upper electrode 25 was formed. A SrRuO$_3$ film (having a film thickness of 40 nm) was formed as an oxide electrode film. Further, a platinum (Pt) film (having a film thickness of 125 mm was formed as a metal electrode film by sputtering. Then, a film was formed by the spin coating method using a photoresist (TSMR8800) manufactured by TOKYO OHKA KOGYO., LTD, a resist pattern was formed by a normal photolithographic method, and a pattern illustrated in FIGS. 3A and 3B was manufactured using an ICP etching device (manufactured by SAMCO INC.).

Next, an Al$_2$O$_3$ film having a film thickness of 50 nm was formed as a first insulation protective film 31, using an atomic layer deposition (ALD) method. At this time, Al of trimethylaluminum (TMA: manufactured by Sigma-Aldrich Co. LLC.) and O$_3$ generated by an ozone generator are alternately supplied as raw materials, and laminated for film formation.

Next, as illustrated in FIGS. 3A and 3B, a contact hole 32 was formed by etching. Next, as a connector 35 between a discrete electrode and a discrete electrode pad, a connector 37 between a common electrode and a common electrode pad, a discrete electrode pad 34, and a common electrode pad 36, a film of Al was formed and patterned by etching.

Next, as a second insulating protective film 38, a film of Si$_3$N$_4$ was formed at a film thickness of 500 nm by a plasma chemical vapor deposition (CVD) method. Then, openings are formed at positions of the discrete electrode pad 34 and the common electrode pad 36, and thus the electromechanical transducer element 200 was produced.

Then, with the polarization processing device 40 illustrated in FIG. 4, polarization processing was performed on the electromechanical transducer element 200 by corona charging. A tungsten wire of ϕ50 μm was used as a corona electrode used for corona charging. Polarization processing conditions were a processing temperature of 80° C., a corona voltage of 9 kV, a grid voltage of 1.5 kV, a processing time of 30 seconds, a distance between the corona electrode and the grid electrode to be 4 mm, and a distance between the grid electrode and a stage to be 4 mm.

Example 2

An electromechanical transducer element 200 was produced in the same manner as that of Example 1 except that a platinum film (having a film thickness of 160 nm) as the lower electrode 23 was formed at a film formation temperature of 500° C. by the sputtering apparatus. Polarization processing was performed on the electromechanical transducer element 200 in the same manner as that of Example 1.

Example 3

As an electromechanical transducer film 24, a film was formed with a PZT precursor solution by spin coating. Except that drying at 120° C. and thermal decomposition at 300° C. were performed after film formation, an electromechanical transducer element was produced in the same manner as that of Example 1. Polarization processing was also performed on the electromechanical transducer element in the same manner as that of Example 1.

Example 4

Except that, after film formation of the lower electrode 23, a TiO$_2$ layer being a base layer, in place of the PbTiO$_3$ layer, was formed at a film thickness of 5 nm by the sputtering apparatus, an electromechanical transducer element was produced in the same manner as that of Example 1. Polarization processing was also performed on the electromechanical transducer element in the same manner as that of Example 1.

Example 5

Except that, as an electromechanical transducer film 24, a solution was prepared in a ratio of Pb:Zr:Ti=115:55:45 and a film was formed with the solution by spin coating, an electromechanical transducer element 200 was produced in the same manner as that of Example 1. Polarization processing was also performed on the electromechanical transducer element 200 in the same manner as that of Example 1.

Example 6

Except that, as an electromechanical transducer film 24, a solution was prepared in a ratio of Pb:Zr:Ti=115:45:55 and a film was formed with the solution by spin coating, an electromechanical transducer element 200 was produced in the same manner as that of Example 1. Polarization processing was also performed on the electromechanical transducer element 200 in the same manner as that of Example 1.

Example 7

As an electromechanical transducer film 24, three solutions were prepared in (1) a ratio of Pb:Zr:Ti=115:55:45, (2) a ratio of Pb:Zr:Ti=115:50:50, and (3) Pb:Zr:Ti=115:45:55. The solution of the ratio (1) was used for a (3n−2)th layer, the solution of the ratio (2) was used for a (3n−1)th layer, and the solution of the ratio (3) was used for a (3n)th layer (n=1 to 8). Except that, after thermal decomposition treatment of the (3n)th layer, crystallization heat treatment (at 730° C.) was performed by rapid thermal annealing (RTA), an electromechanical transducer element was produced in the same manner as that of Example 1. Polarization processing was also performed on the electromechanical transducer element in the same manner as that of Example 1.

Example 8

As an electromechanical transducer film, three solutions were prepared in (1) a ratio of Pb:Zr:Ti=115:47:53, (2) a ratio of Pb:Zr:Ti=115:50:50, and (3) Pb:Zr:Ti=115:53:47. The solution of the ratio (1) was used for a (3n−2)th layer, the solution of the ratio (2) was used for a (3n−1)th layer, and the solution of the ratio (3) was used for a (3n)th layer (n=1 to 8). Except that, after thermal decomposition treatment of the (3n)th layer, crystallization heat treatment (at 730° C.) was performed by rapid thermal annealing (RTA), an electromechanical transducer element was produced in the same manner as that of Example 1. Polarization processing was also performed on the electromechanical transducer element in the same manner as that of Example 1.

Comparative Example 1

Except that a STO (SrTiO$_3$) substrate was prepared as a base substrate and a SrRuO$_3$ film and a LaNiO$_3$ film were formed as the lower electrode by the sputtering apparatus, an electromechanical transducer element was produced in the same manner as that of Example 1. Polarization processing was also performed on the electromechanical transducer element in the same manner as that of Example 1.

Comparative Example 2

As an electromechanical transducer film, three solutions were prepared in (1) a ratio of Pb:Zr:Ti=115:42:58, (2) a ratio of Pb:Zr:Ti=115:50:50, and (3) Pb:Zr:Ti=115:58:42. The solution of the ratio (1) was used for a (3n−2)th layer, the solution of the ratio (2) was used for a (3n−1)th layer, and the solution of the ratio (3) was used for a (3n)th layer (n=1 to 8). Except that, after thermal decomposition treatment of the (3n)th layer, crystallization heat treatment (at 730° C.) was performed by rapid thermal annealing (RTA), an electromechanical transducer element was produced in the same manner as that of Example 1. Polarization processing was also performed on the electromechanical transducer element in the same manner as that of Example 1.

Comparative Example 3

As an electromechanical transducer film, three solutions were prepared in (1) a ratio of Pb:Zr:Ti=115:42:58, (2) a ratio of Pb:Zr:Ti=115:50:50, and (3) Pb:Zr:Ti=115:58:42. The solution of the ratio (1) was used for a (3n−2)th layer, the solution of the ratio (2) was used for a (3n−1)th layer, and the solution of the ratio (3) was used for a (3n)th layer (n=1 to 8). Except that, after thermal decomposition treatment of the (3n)th layer, crystallization heat treatment (at 730° C.) was performed by rapid thermal annealing (RTA), an electromechanical transducer element was produced in the same manner as that of Example 1. However, polarization processing was not performed on the electromechanical transducer element.

With the electromechanical transducer elements produced in the above-described Examples 1 to 8 and Comparative Examples 1 to 3, crystallinity was evaluated by the θ-2θ measurement according to an X-ray diffraction (XRD) method just after the electromechanical transducer film (PZT film) was formed in the production process. An XRD apparatus used in the measurement was X'PertMRD (manufactured by Phillips). The X-ray source was CuKα and the wavelength of X-ray was 1.541 Å (0.1541 nm). Slit ¼ and Mask 15 were used.

Figure 12:
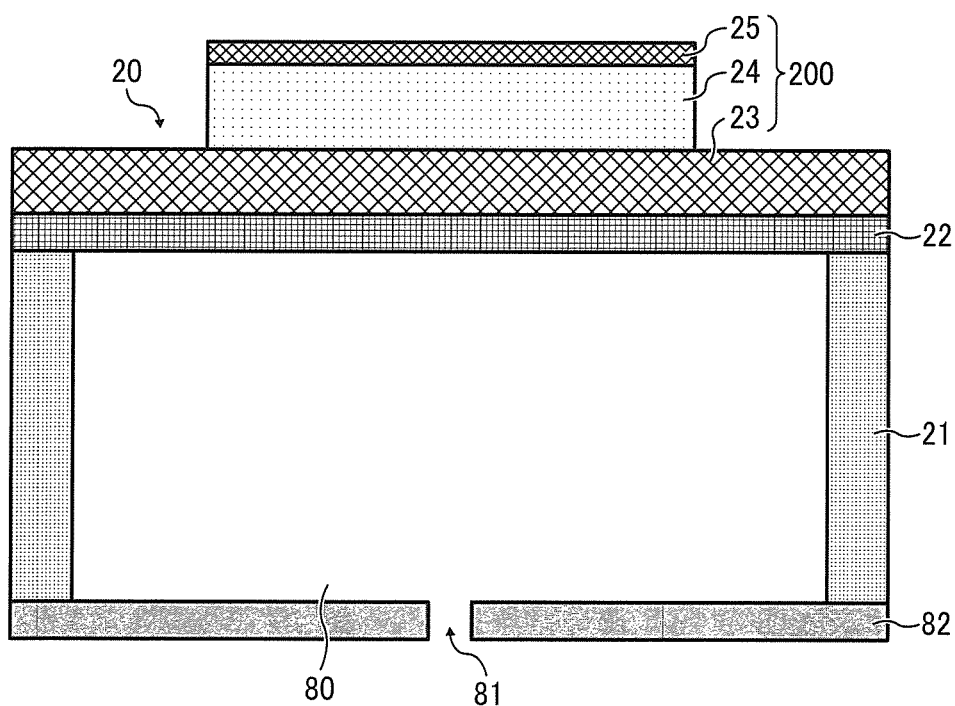
FIG. 12 is a cross-sectional view of a droplet discharge head according to an embodiment of the present disclosure.

Electric properties and deformation (surface displacement) properties (piezoelectric constant) were also evaluated. In the evaluation of deformation (surface displacement) properties, as illustrated in FIG. 12, drilling was performed from the back side of the substrate 21 and the evaluation of vibration was performed. For example, when a drive voltage of a predetermined pulse waveform (a triangular waveform of 1 kHz) to form an electric field of 150 kV/cm is applied the electromechanical transducer element, the amount of deformation of the lower surface of the diaphragm 22 is measured with a laser Doppler vibrometer. Then, the value of d31 was calculated through matching with simulation results. After initial properties were evaluated, durability properties (immediately after the drive voltage having the above-described predetermined pulse waveform was repetitively applied $1 \times 10^{10}$ times) were evaluated. In the evaluation of the variation ratio ΔZr of the above-described lamination interface of Zr, composition analysis was performed in the film thickness direction of the electromechanical transducer film by TEM (transmission electron microscope)–EDS (energy dispersive X-ray spectroscopy) analysis. Evaluation results of Examples 1 to 8 and Comparative Examples 1 to 3 are shown in Table 1-1 and Table 1-2 with orientation rate, Sc/(Sa+Sc), Sc/(Sa+Sc+Sb), and occurrence/non-occurrence of crack.

TABLE 1-1

|  | PZT(110) + PZT(111) Orientation ratio | Sc/ (Sa + Sc) | Sc/ (Sa + Sc + Sb) | ΔZr | Occurrence/ non-occurrence of crack |
|---|---|---|---|---|---|
| Example 1 | 0.04% | 17.0% | 13.0% | 6.0% | Non occurrence |
| Example 2 | 0.80% | 16.2% | 12.5% | 5.0% | Non occurrence |
| Example 3 | 3.20% | 19.4% | 17.2% | 10.0% | Non occurrence |
| Example 4 | 24.30% | 18.2% | 16.3% | 6.3% | Non occurrence |
| Example 5 | 0.90% | 6.1% | 3.6% | 5.1% | Non occurrence |
| Example 6 | 1.30% | 19.8% | 17.6% | 7.3% | Non occurrence |
| Example 7 | 0.02% | 15.1% | 13.1% | 2.9% | Non occurrence |
| Example 8 | 0.10% | 19.3% | 17.5% | 19.1% | Non occurrence |
| Comparative Example 1 | 0% | 24.0% | 21.0% | 4.0% | Occurrence |
| Comparative Example 2 | 0.50% | 25.0% | 22.0% | 28.0% | Occurrence |
| Comparative Example 3 | 0.50% | 25.0% | 22.0% | 28.0% | Non occurrence |

TABLE 1-2

| | d31 [pm/V] | | |
| --- | --- | --- | --- |
| | Initial | After $10^{10}$ times driving | Variation Ratio |
| Example 1 | −142 | −139 | −2.1% |
| Example 2 | −144 | −140 | −2.8% |
| Example 3 | −142 | −138 | −2.8% |
| Example 4 | −127 | −123 | −3.1% |
| Example 5 | −131 | −128 | −2.3% |
| Example 6 | −144 | −131 | −9.0% |
| Example 7 | −154 | −149 | −3.2% |
| Example 8 | −130 | −126 | −3.1% |
| Comparative Example 1 | — | — | — |
| Comparative Example 2 | — | — | — |
| Comparative Example 3 | −130 | −91 | −30.0% |

From the test results of the initial properties and the durability properties, it was found that Examples 1 to 8 had the same properties as those of a typical ceramic sintered object. Converting into the value of piezoelectric constant, properties in the range of from -120 pm/V to −160 pm/V were obtained as initial properties. The variation ratio of the absolute value of piezoelectric constant d31 from initial properties to properties after the durability test was not greater than 9%.

By contrast, Comparative Example 1 was found to be an epitaxial or c-axis oriented film in which {110} plane orientation and {111} plane orientation were not observed. For Comparative Example 1, a crack occurred in the step of polarization processing, and therefore the subsequent evaluations were not performed. Likewise, in Comparative Example 2, a crack occurred in the step of polarization processing. In Comparative Example 3, no crack occurred since the step of polarization processing was not performed. However, in evaluation results after the subsequent durability test, it was observed that deformation (surface displacement) properties (piezoelectric constant) were more degraded than Examples 1 to 8. For example, the variation ratio of the absolute value of piezoelectric constant d31 from initial properties to properties after the durability test was 30%.

Next, a droplet discharge head including an electromechanical transducer element according to this embodiment is described below.

Figure 13:
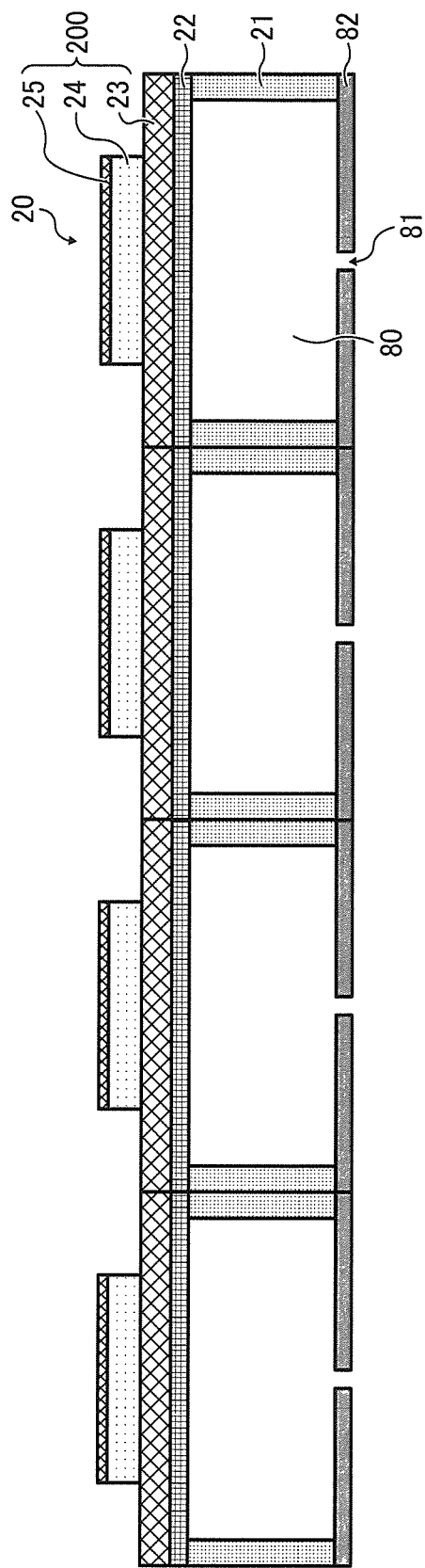
FIG. 13 is a cross-sectional view of a configuration example in which a plurality of liquid discharge heads are arranged.

FIG. 12 is a cross-sectional view of an example of a schematic configuration of a droplet discharge head according to this embodiment. FIG. 13 is a cross-sectional view of an example of a configuration in which a plurality of droplet discharge heads according to this embodiment is arranged.

As illustrated in FIG. 12, the droplet discharge head according to this embodiment includes nozzles 81 to discharge droplets, a pressurizing chamber 80 communicated with the nozzles 81, and a discharge drive unit to increase the pressure of liquid in the pressurizing chamber 80. The discharge drive unit includes a diaphragm 22 constituting part of a wall of the pressurizing chamber 80 and the above-described electromechanical transducer element 200 disposed on the diaphragm 22.

In the droplet discharge head according to this embodiment, the pressurizing chamber 80 is disposed in the substrate 21. A nozzle plate 82 including the nozzles 81 to discharge droplets is disposed at a lower end of the pressurizing chamber 80. When voltage is applied to the electromechanical transducer element 200 and displaces the electromechanical transducer film 24, the diaphragm 22 is deformed (the surface of the diaphragm 22 is displaced) to discharge liquid of the pressurizing chamber 80 from the nozzles 81. As illustrated in FIG. 13, the plurality of droplet discharge heads may be disposed. The droplet discharge head may include, for example, a liquid supply unit to supply liquid, such as ink, to the pressurizing chamber 80 and a channel through which liquid flows. In a configuration in which the droplet discharge head includes the channel, the fluid resistance of the channel against the liquid may be considered.

The droplet discharge head includes the above-described electromechanical transducer element 200. Accordingly, the electromechanical transducer element 200 obtains a sufficient amount of deformation (amount of surface displacement) to preferably maintain discharge properties and sufficiently suppress degradation of the amount of deformation (the amount of surface displacement) even after continuous discharge, thus allowing the droplet discharge head to perform stable droplet discharge.

Next, a description is given of a droplet discharge apparatus including a droplet discharge head according to an embodiment of the present disclosure.

Figure 14:
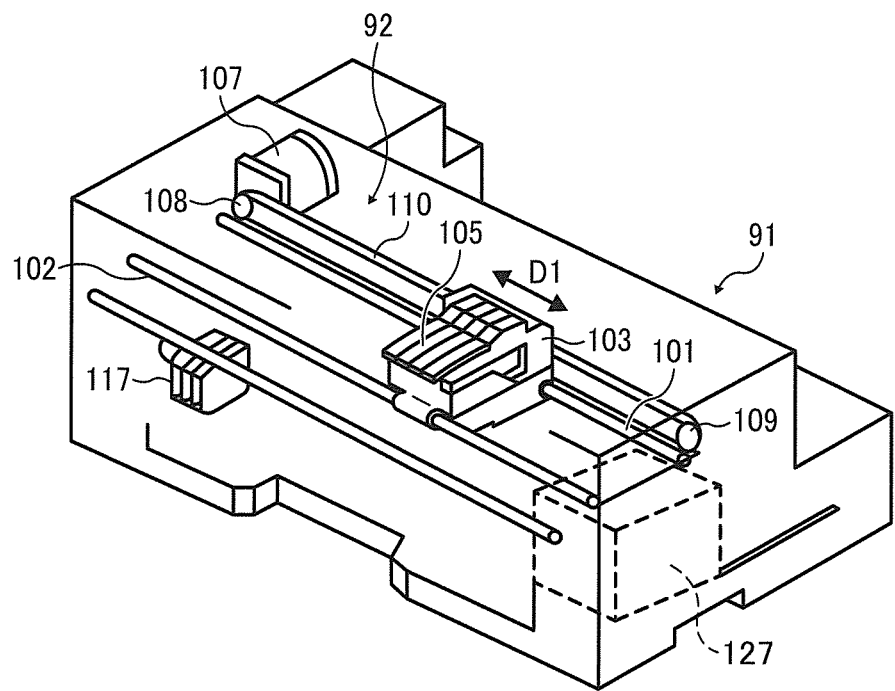
FIG. 14 is a perspective view of an example of a droplet discharge apparatus according to an embodiment of the present disclosure.
Figure 15:
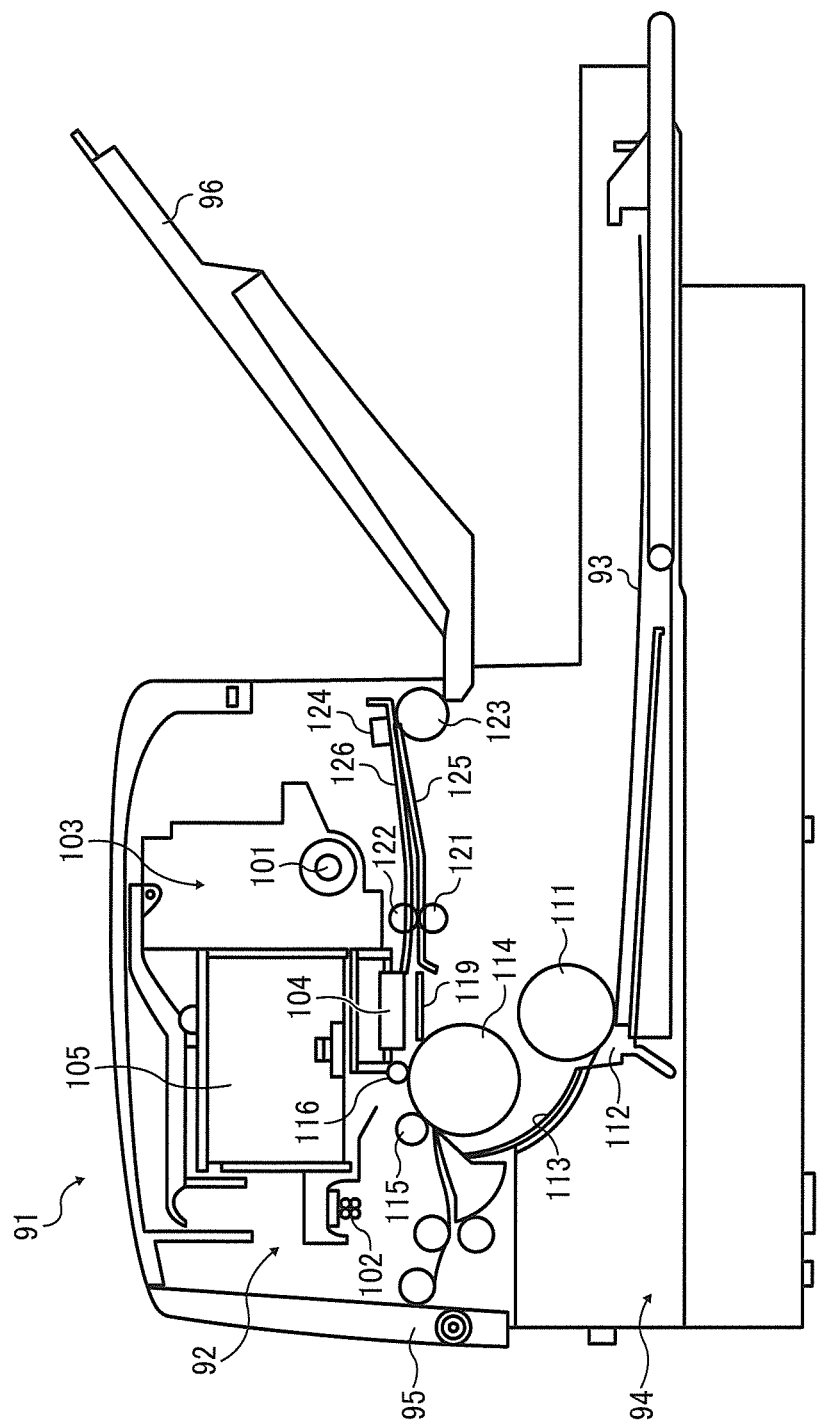
FIG. 15 is a side view of an example of a mechanical section of the droplet discharge apparatus of FIG. 14.

FIG. 14 is a perspective view of an example of a droplet discharge apparatus according to an embodiment of the present disclosure. FIG. 15 is a side view of an example of a mechanical section of the droplet discharge apparatus of FIG. 14. In FIGS. 14 and 15, an inkjet recording apparatus being an image forming apparatus is illustrated as an example of the droplet discharge apparatus.

The droplet discharge apparatus according to this embodiment includes, e.g., a printing assembly 92 inside a recording apparatus body 91. The printing assembly 92 includes, e.g., a carriage 103, recording heads 104, and ink cartridges 105. The carriage 103 is movable in a main scanning direction indicated by arrow D1 in FIG. 14. The recording heads 104 are constituted of liquid discharge heads mounted on the carriage 103. The ink cartridges 105 supply ink to the recording heads 104.

A sheet feeding cassette (or a sheet feeding tray) 94 is removably mountable to a lower portion of the recording apparatus body 91. From the front side of the recording apparatus body 91, a plurality of sheets 93 can be stacked on the sheet feeding cassette 94. A bypass tray 95 is tiltably disposed to the recording apparatus body 91 to be openable so that a user can manually stack sheets 93 on the bypass tray 95. When a sheet 93 fed from the sheet feeding cassette 94 or the bypass tray 95 is taken in, the printing assembly 92 records a desired image on the sheet 93. Then, the sheet 93 is ejected to a sheet ejection tray 96 mounted on a back face side of the recording apparatus body 91.

In the printing assembly 92, a main guide rod 101 and a sub-guide rod 102 as guides laterally bridged between left and right side plates support the carriage 103 slidably in the main scanning direction D1. The carriage 103 mounts the recording heads 104 constituted of liquid discharge heads configured to discharge ink droplets of different colors of yellow (Y), cyan (C), magenta (M), and black (Bk) such that ink discharge ports (nozzles) of the recording heads 104 are arrayed in a direction perpendicular to the main scanning direction D1. The recording heads 104 are mounted on the carriage 103 such that ink discharge directions are oriented downward. The carriage 103 also replaceably mount the ink cartridges 105 to supply different colors of ink to the recording heads 104.

Each of the ink cartridges 105 has an atmosphere communication port at an upper portion thereof to communicate with the atmosphere, a supply port at a lower portion thereof to supply ink to the recording heads 104, and a porous body inside to be filled with ink. Ink to be supplied to the recording heads 104 is maintained at a slightly negative pressure by capillary force of the porous body of each ink cartridge 105. In this example, the plurality of recording heads 104 is used as the recording heads of the liquid discharge apparatus. However, in some embodiments, a single head having nozzles to discharge different colors of ink droplets may be used as the recording head.

Note that a rear side of the carriage 103 (downstream in a sheet conveyance direction) is slidably fitted to the main guide rod 101, and a front side of the carriage 89 (upstream in the sheet conveyance direction) is slidably fitted to the sub-guide rod 102. A timing belt 110 is stretched taut between a drive pulley 108, which is driven by a main scanning motor 107 to rotate, and a driven pulley 109, to move the carriage 103 for scanning in the main scanning direction D1. The timing belt 110 is secured to the carriage 103, and the carriage 103 is reciprocally moved by the forward and reverse rotation of the main scanning motor 107.

Next, a description is given of a conveyance assembly to convey a sheet 93, which is set in the sheet feeding cassette 94, to a position below the recording heads 104. The conveyance assembly includes a sheet feed roller 111 and a friction pad 112 to separate and feed the sheet 93 from the sheet feeding cassette 94, a guide 113 to guide the sheet 93, and a conveyance roller 114 to reverse and convey the sheet 93 fed from the sheet feeding cassette 94. The conveyance assembly further includes a conveyance roller 115 pressed against a circumferential surface of the conveyance roller 114 and a leading end roller 116 to define an angle at which the sheet 93 is fed from the conveyance roller 114. The conveyance roller 114 is driven for rotation by a sub-scanning motor 117 via a gear train.

The conveyance assembly further includes a print receiver 119 as a sheet guide to guide the sheet 93, which is fed from the conveyance roller 114, in accordance with a range of movement of the carriage 103 in the main scanning direction D1. The droplet discharge apparatus further includes a conveyance roller 121 and a spur roller 122 downstream from the print receiver 119 in the sheet conveyance direction such that the conveyance roller 121 and the spur roller 122 rotationally be driven to convey the sheet 93 in a sheet ejection direction. The droplet discharge apparatus further includes a sheet ejection roller 123 and a spur roller 124 to feed the sheet 93 to the sheet ejection tray 96, and guides 125 and 126 forming a sheet ejection path.

When the droplet discharge apparatus performs recording, the droplet discharge apparatus drives the recording heads 104 in accordance with image signals while moving the carriage 103, discharges ink onto the stopped sheet 93 to record one line on the sheet 93, feeds the sheet 93 by a predetermined amount, and then records a next line on the sheet 93. When the droplet discharge apparatus receives a recording end signal or a signal indicating the arrival of a trailing end of the sheet 93 at a recording area, the droplet discharge apparatus terminates a recording operation and ejects the sheet 93.

Further, the droplet discharge apparatus further includes a recovery device 127 to recover the recording heads 104 from a discharge failure. The recovery device 127 includes a capping device, a suction device, and a cleaning device. During standby for printing, the carriage 103 is moved toward the recovery device 127 and the recording heads 104 are capped with the capping device. Thus, discharge ports are maintained in humid state, thus preventing discharge failure due to dry of ink. In addition, for example, during recording, ink not relating to the recording is discharged to maintain the viscosity of ink in all of the discharge ports constant, thus maintaining stable discharging performance.

When a discharge failure occurs, the discharge ports (nozzles) of the droplet discharge heads 104 are sealed by the capping device and ink and bubbles are sucked from the discharge ports by the suction device through a tube. The cleaning device removes ink and dusts adhered to a discharge port face, thus recovering the discharge failure. In addition, the sucked ink is drained to a waste ink container disposed on a lower portion of the recording apparatus body 91, is absorbed into an ink absorber in the waste ink container, and is retained in the ink absorber.

The droplet discharge apparatus according to this embodiment includes the above-described droplet discharge heads. Accordingly, the electromechanical transducer elements of the droplet discharge head secure a sufficient amount of deformation (amount of surface displacement) to preferably maintain ink discharge properties and sufficiently suppress degradation of the amount of deformation (the amount of surface displacement) even after continuous discharge, thus allowing the droplet discharge apparatus to perform stable ink discharge.

The image forming apparatus (the inkjet recording apparatus) as the droplet discharge apparatus according to this embodiment mounts the droplet discharge heads according to any of the above-described Examples 1 to 8. Accordingly, the image forming apparatus can suppress discharge failure of ink droplets due to drive failure of the diaphragm and fluctuations of the amount of deformation (the amount of surface displacement) of the electromechanical transducer element (piezoelectric element) over time. Such a configuration obtains stable ink droplet discharge properties, thus enhancing image quality.

The liquid discharge heads of FIGS. 12 and 13 were produced using the electromechanical transducer elements prepared in Examples 1 to 8, and were evaluated for the discharging performance of ink. Observing a discharged state when a voltage of from −10 V to −30 V was applied by a simple push waveform using ink of which viscosity was adjusted to 5 cp, it was confirmed that ink droplets were discharged from all of the nozzles.

In the above-described embodiments, the image forming apparatus discharges droplets from the droplet discharge heads to land the droplets on a sheet to form an image on the sheet. However, in some embodiments, the configurations illustrated in the above-described embodiments are applicable to a droplet discharge device other than such an image forming apparatus having the droplet discharge heads. For example, the configurations illustrated in the above-described embodiments are similarly applicable to droplet discharge apparatuses that can use media (recording medium, transfer material, and recording sheets) other than sheets of paper as media on which droplets are landed and adhered. In addition, the configurations illustrated in the above-described embodiments are similarly applicable to droplet discharge apparatuses that can use media, such as paper, thread, fiber, fabric, leather, metals, plastics, glass, wood, ceramics, and the like, as media on which droplets are landed and adhered. The configurations illustrated in the above-described embodiments are also applicable to droplet discharge apparatuses that apply not only meaningful images, such as characters and figures, but also meaningless images, such as patterns, to media (simply discharge droplets to media). The configurations illustrated in the above-described embodiments are also applicable to droplet discharge apparatuses that discharge liquid resist for patterning to land the liquid resist onto a landing target medium. The configurations illustrated in the above-described embodiments are also applicable to droplet discharge apparatuses that discharge genetic analysis samples (DNA samples) to land the samples onto a landing target medium or droplet discharge apparatuses for three-dimensional fabrication. The image forming apparatuses according to the above-described embodiments include both serial-type image forming apparatuses and line-type image forming apparatuses.

The above-described embodiments and examples are limited examples, and the present disclosure includes, for example, the following aspects having advantages.

Aspect A

An electromechanical transducer element, such as the electromechanical transducer element 200, includes: a first electrode, such as the lower electrode 23, directly on or indirectly above a substrate, such as the substrate 21, or a base film, such as the base film 22; an electromechanical transducer film, such as the electromechanical transducer film 24, disposed on the first electrode and having a perovskite crystal; and a second electrode, such as the upper electrode 25, disposed on the electromechanical transducer film. The electromechanical transducer film, such as the electromechanical transducer film 24, is a preferentially oriented polycrystalline film in which {100} plane is preferentially oriented. A sum of an orientation degree $\rho\{111\}$ of $\{111\}$ plane and an orientation degree $\rho\{100\}$ of $\{100\}$ plane is in a range of not less than 0.0002 and not greater than 0.25, where I{hkl} represents a peak intensity of a diffraction peak derived from an {hkl} plane obtained by a $\theta$-2$\theta$ measurement of the electromechanical transducer film according to an X-ray diffraction method, $\Sigma$I{hkl} represents a total sum of peak intensities of a plurality of diffraction peaks obtained by the $\theta$-2$\theta$ measurement of the electromechanical transducer film according to an X-ray diffraction method, and $\rho\{hkl\}$ represents an orientation degree of an {hkl} plane of the electromechanical transducer film and is expressed by a formula of $\rho\{hkl\}=I\{hkl\}/\Sigma I\{hkl\}$. At least two diffraction peaks of a plurality of diffraction peaks separated in diffraction peaks derived from $\{200\}$ plane or $\{400\}$ plane obtained by the $\theta$-2$\theta$ measurement of the electromechanical transducer film according to the X-ray diffraction method attribute to a tetragonal a-domain structure and a tetragonal c-domain structure, respectively. A value of Sc/(Sa+Sc) is not greater than 20%, where Sa represents an area of a diffraction peak attributing to the tetragonal a-domain structure and Sc represents an area of a diffraction peak attributing to the tetragonal c-domain structure.

For such a configuration, as described above in the above-described embodiments and Examples 1 to 8, the electromechanical transducer film, such as the electromechanical transducer film 24, is a {100} preferentially oriented polycrystalline film, and the sum of the orientation degree $\rho\{111\}$ of $\{111\}$ plane and the orientation degree $\rho\{100\}$ of $\{100\}$ plane is in the range of not less than 0.0002 and not greater than 0.25. In addition, the above-described value of Sc/(Sa+Sc) is not greater than 20%. With such a configuration, in driving by application of a drive voltage having a predetermined pulse waveform in an initial stage after production, a sufficient amount of deformation (120 pm/V to 160 pm/V in the absolute value of converted piezoelectric constant d31) is obtained. Such a configuration also allows polarization processing to be performed on the electromechanical transducer film by applying charges to the electromechanical transducer film by electric discharge, without causing cracks in the electromechanical transducer film. Such polarization processing suppresses the reduction over time in the amount of deformation in continuous driving, in which the drive voltage of the above-described predetermined pulse waveform is repeatedly applied $10^{10}$ times for driving, within a predetermined range (9% when converted to the variation ratio of the absolute value of piezoelectric constant d31).

As described above, such a configuration provides an electromechanical transducer element including an electromechanical transducer film that obtains a sufficient amount of deformation in driving at an initial stage after production and suppresses the reduction over time in the amount of deformation in continuous driving without causing cracks.

Aspect B

In the electromechanical transducer element according to the above-described Aspect A, at least two diffraction peaks of a plurality of diffraction peaks separated in diffraction peaks derived from $\{200\}$ plane or $\{400\}$ plane obtained by the $\theta$-2$\theta$ measurement of the electromechanical transducer film according to the X-ray diffraction method attribute to the tetragonal a-domain structure and the tetragonal c-domain structure, respectively, and another diffraction peak of the plurality of diffraction peaks separated attribute to any one of a rhombohedral structure, an orthorhombic structure, and a pseudo-cubic structure. The value of Sc/(Sa+Sc) is not greater than 18%, where Sb represents an area of a diffraction peak attributing to the tetragonal a-domain structure.

As described in the above-described embodiments and Examples 1 to 8, when the electromechanical transducer film includes any one of a rhombohedral structure, an orthorhombic structure, and a pseudo-cubic structure, such a configuration provides an electromechanical transducer element including an electromechanical transducer film that obtains a sufficient amount of deformation in driving at the initial stage and suppresses the reduction over time in the amount of deformation in continuous driving without causing cracks.

Aspect C

In the electromechanical transducer element according to the above-described Aspect A or B, the electromechanical transducer film, such as the electromechanical transducer film 24, is made of lead zirconate titanate (PZT) and a value of Ti/(Zr+Ti) is in a range of not less than 45% and not greater than 55%, where Ti/(Zr+Ti) represents a composition ratio of Zr and Ti in the electromechanical transducer film.

As described in the above-described embodiments, the above-described composition ratio of not less than 45% and not greater than 55% provides an electromechanical transducer element including a PZT film that suppresses the reduction over time in the amount of deformation in continuous driving, in which the drive by application the predetermined drive voltage is repeatedly performed, without causing cracks.

Aspect D

In the electromechanical transducer element according to any one of the above-described Aspects A to C, in a state in which the electromechanical transducer film, such as the electromechanical transducer film 24, is constrained by the substrate or the base film, a diffraction peak position of an X-ray derived from the $\{200\}$ plane of the electromechanical transducer film is in a range of $44.50°\leq 2\theta \leq 44.80°$. A diffraction peak shape derived from the $\{200\}$ plane or the $\{400\}$ plane is asymmetric.

As described in the above-described embodiments, such a configuration obtains a sufficient amount of displacement due to rotational distortion and piezoelectric strain of the electromechanical transducer film.

Aspect E

In the electromechanical transducer element according to any one of the above-described Aspects A to D, the electromechanical transducer film, such as the electromechanical transducer film 24, is a film formed according to a chemical solution method by laminating a plurality of PZT thin films one on another by repeating a precursor film creation step of creating a PZT precursor film and a sintering step of crystallizing the PZT precursor film until a predetermined thickness is obtained. A value of ΔZr is not greater than 20%, where Zr(ave) represents a value of an atomic weight ratio, Zr/(Zr+Ti), of Zr entirely contained in the electromechanical transducer film having the predetermined thickness, Zr(interface) represents a value of the atomic weight ratio, Zr/(Zr+Ti), of Zr at a lamination interface of the plurality of PZT thin films constituting the electromechanical transducer film, and ΔZr represents a variation ratio of Zr at the lamination interface expressed by ΔZr=Zr(interface)−Zr(ave).

As described in the above-described embodiments, the variation ratio of ΔZr not greater than 20% provides an electromechanical transducer element including a PZT film that suppresses the reduction over time in the amount of deformation in continuous driving, in which the drive by application the predetermined drive voltage is repeatedly performed, without causing cracks.

Aspect F

In the electromechanical transducer element according to any one of the above-described Aspects A to E, a seed layer made of lead titanate (PT) is disposed between the electromechanical transducer film, such as the electromechanical transducer film 24, and the first electrode.

As described in the above-described embodiments, the seed layer made of lead titanate (PT) between the electromechanical transducer film and first electrode 142 allows reliable suppression of the reduction in the amount of deformation in continuous driving.

Aspect G

In the electromechanical transducer element according to any one of the above-described Aspects A to F, when a hysteresis loop is measured with an electric field intensity of ±150 kV/cm applied to the electromechanical transducer film by application of a voltage, a polarization rate obtained by Pr-Pini is not greater than 10 μC/cm$^2$, where Pini represents a polarization at 0 kV/cm before application of the voltage, and Pr represents a polarization at 0 kV/cm when the electric field intensity is returned to 0 kV/cm after application of the voltage.

As described in the above-described embodiments, the polarization rate Pr-Pini of not greater than 10 μC/cm$^2$ allows sufficient polarization of the electromechanical transducer film, stabilizes the amount of deformation relative to the predetermined drive voltage, and provides sufficient properties in degradation of the amount of deformation after continuous driving.

Aspect H

In Aspect H, a method of producing the electromechanical transducer element, such as the electromechanical transducer film 24, according to any one of the above-described Aspects A to G includes forming the first electrode directly on or indirectly above one of the substrate and the base film; forming the electromechanical transducer film on the first electrode; forming the second electrode on the electromechanical transducer film; and performing polarization processing on the electromechanical transducer film with positive charges generated by corona discharge.

As described in the above-described embodiments and Examples 1 to 8, such a configuration allows polarization processing to be effectively performed in non-contact manner while suppressing the reduction over time in the amount of deformation in continuous driving.

Aspect I

A droplet discharge head includes: a nozzle, such as the nozzles 81, to discharge droplets; a pressurizing chamber, such as the pressurizing chamber 80, communicated with the nozzle; and a discharge drive unit to increase a pressure of liquid in the pressurizing chamber. The discharge drive unit includes a diaphragm, such as the diaphragm 22, constituting part of a wall of the pressurizing chamber; and the electromechanical transducer element, such as the electromechanical transducer element 200, according to any one of Aspects A to G disposed on the diaphragm.

As described in the above-described embodiments, such a configuration allows stable droplet discharge properties even when droplets are continuously discharged.

Aspect J

A droplet discharge apparatus includes the droplet discharge head according to Aspect I.

As described in the above-described embodiments, such a configuration allows stable droplet discharge properties even when droplets are continuously discharged.

Numerous additional modifications and variations are possible in light of the above teachings. It is therefore to be understood that, within the scope of the above teachings, the present disclosure may be practiced otherwise than as specifically described herein. With some embodiments having thus been described, it will be obvious that the same may be varied in many ways. Such variations are not to be regarded as a departure from the scope of the present disclosure and appended claims, and all such modifications are intended to be included within the scope of the present disclosure and appended claims.

What is claimed is:

1. An electromechanical transducer element comprising:
   a first electrode directly on or indirectly above one of a substrate and a base film;
   an electromechanical transducer film disposed on the first electrode and having a perovskite crystal; and
   a second electrode disposed on the electromechanical transducer film,
   wherein the electromechanical transducer film is a {100} preferentially oriented polycrystalline film in which {100} plane is preferentially oriented,
   wherein a sum of an orientation degree ρ{111} of {111} plane and an orientation degree ρ{100} of {100} plane is in a range of not less than 0.0002 and not greater than 0.25,
      where I{hkl} represents a peak intensity of a diffraction peak derived from an {hkl} plane obtained by a θ-2θ measurement of the electromechanical transducer film according to an X-ray diffraction method,
      ΣI{hkl} represents a total sum of peak intensities of a plurality of diffraction peaks obtained by the θ-2θ measurement of the electromechanical transducer film according to an X-ray diffraction method, and
      ρ{hkl} represents an orientation degree of an {hkl} plane of the electromechanical transducer film and is expressed by a formula of $$\rho\{hkl\}=I\{hkl\}/\Sigma I\{hkl\},$$

wherein at least two diffraction peaks of a plurality of diffraction peaks separated in diffraction peaks derived from {200} plane or {400} plane obtained by the θ-2θ measurement of the electromechanical transducer film according to the X-ray diffraction method attribute to a tetragonal a-domain structure and a tetragonal c-domain structure, respectively, and wherein a value of Sc/(Sa+Sc) is not greater than 20%, where Sa represents an area of a diffraction peak attributing to the tetragonal a-domain structure and Sc represents an area of a diffraction peak attributing to the tetragonal c-domain structure.

2. The electromechanical transducer element according to claim 1, wherein another diffraction peak of the plurality of diffraction peaks separated in diffraction peaks derived from the {200} plane or the {400} plane attribute to any one of a rhombohedral structure, an orthorhombic structure, and a pseudo-cubic structure, and wherein the value of Sc/(Sa+Sc) is not greater than 18%, where Sb represents an area of a diffraction peak attributing to the tetragonal a-domain structure.

3. The electromechanical transducer element according to claim 1, wherein the electromechanical transducer film is made of lead zirconate titanate (PZT), and wherein a value of Ti/(Zr+Ti) is in a range of not less than 45% and not greater than 55%,
where Ti/(Zr+Ti) represents a composition ratio of Zr and Ti in the electromechanical transducer film.

4. The electromechanical transducer element according to claim 1, wherein, in a state in which the electromechanical transducer film is constrained by the one of the substrate and the base film, a diffraction peak position of an X-ray derived from the {200} plane of the electromechanical transducer film is in a range of 44.50°≤2θ≤44.80°, and wherein a diffraction peak shape derived from the {200} plane or the {400} plane is asymmetric.

5. The electromechanical transducer element according to claim 1, wherein the electromechanical transducer film is a film formed according to a chemical solution method by laminating a plurality of PZT thin films one on another by repeating a precursor film creation step of creating a PZT precursor film and a sintering step of crystallizing the PZT precursor film until a predetermined thickness is obtained, and wherein a value of ΔZr is not greater than 20%, where Zr(ave) represents a value of an atomic weight ratio, Zr/(Zr+Ti), of Zr entirely contained in the electromechanical transducer film having the predetermined thickness, Zr(interface) represents a value of the atomic weight ratio, Zr/(Zr+Ti), of Zr at a lamination interface of the plurality of PZT thin films constituting the electromechanical transducer film, and ΔZr represents a variation ratio of Zr at the lamination interface expressed by ΔZr=Zr(interface)−Zr(ave).

6. The electromechanical transducer element according to claim 1, further comprising a seed layer made of lead titanate (PT) between the electromechanical transducer film and the first electrode.

7. The electromechanical transducer element according to claim 1, wherein, when a hysteresis loop is measured with an electric field intensity of +150 kV/cm applied to the electromechanical transducer film by application of a voltage, a polarization rate obtained by Pr-Pini is not greater than 10 μC/cm$^2$, where Pini represents a polarization at 0 kV/cm before application of the voltage, and Pr represents a polarization at 0 kV/cm when the electric field intensity is returned to 0 kV/cm after application of the voltage.

8. A method of producing the electromechanical transducer element according to claim 1, the method comprising:

forming the first electrode directly on or indirectly above one of the substrate and the base film;

forming the electromechanical transducer film on the first electrode;

forming the second electrode on the electromechanical transducer film; and performing polarization processing on the electromechanical transducer film with positive charges generated by corona discharge.

9. A droplet discharge head comprising:

a nozzle to discharge droplets;

a pressurizing chamber communicated with the nozzle; and a discharge drive unit to increase a pressure of liquid in the pressurizing chamber, wherein the discharge drive unit including:

a diaphragm constituting part of a wall of the pressurizing chamber; and the electromechanical transducer element according to claim 1 disposed on the diaphragm.

10. A droplet discharge apparatus comprising the droplet discharge head according to claim 9.

* * * * *